US011043359B2

(12) United States Patent
Nakamura et al.

(10) Patent No.: US 11,043,359 B2
(45) Date of Patent: Jun. 22, 2021

(54) CHARGED PARTICLE BEAM APPARATUS AND CHARGED PARTICLE BEAM INSPECTION SYSTEM

(71) Applicant: Hitachi High-Tech Corporation, Tokyo (JP)

(72) Inventors: Yohei Nakamura, Tokyo (JP); Natsuki Tsuno, Tokyo (JP); Heita Kimizuka, Tokyo (JP); Takafumi Miwa, Tokyo (JP); Muneyuki Fukuda, Tokyo (JP); Junichi Tanaka, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/920,927

(22) Filed: Jul. 6, 2020

(65) Prior Publication Data
US 2021/0043419 A1 Feb. 11, 2021

(30) Foreign Application Priority Data

Aug. 8, 2019 (JP) .............................. JP2019-146173

(51) Int. Cl.
H01J 37/244 (2006.01)
H01J 37/28 (2006.01)
H01J 37/26 (2006.01)

(52) U.S. Cl.
CPC ............ H01J 37/28 (2013.01); H01J 37/244 (2013.01); H01J 37/265 (2013.01); H01J 2237/2817 (2013.01)

(58) Field of Classification Search
CPC .. H01J 37/00; H01J 37/02; H01J 37/22; H01J 37/222; H01J 37/24; H01J 37/28; H01J 37/265; H01J 37/244; H01J 2237/2817
(Continued)

(56) References Cited

U.S. PATENT DOCUMENTS 7,235,800 B1 * 6/2007 Goruganthu ......... G01R 31/307
250/310
8,497,476 B2 7/2013 Hatakeyama et al.
(Continued)

FOREIGN PATENT DOCUMENTS

JP 2003100823 A 4/2003
JP 2008130582 A 6/2008
(Continued)

OTHER PUBLICATIONS

Office Action dated Mar. 17, 2021 in corresponding Taiwanese Application No. 109122713.

Primary Examiner — Jason L McCormack
(74) Attorney, Agent, or Firm — Miles & Stockbridge, P.C.

(57) ABSTRACT

Provided are a charged particle beam apparatus and a charged particle beam inspection system capable of estimating electrical characteristics of a sample including capacitance characteristics. The charged particle beam apparatus estimates electrical characteristics of the sample using the correspondence data representing the correspondence between the node of the netlist and the coordinate on the sample and the pulsing condition when the sample is irradiated with the charged particle beam in a pulsed manner. The charged particle beam optical system irradiates a predetermined coordinate on the sample with a charged particle beam based on a pulsing condition, and the detector actually measures an emission amount of electrons. The emission amount calculation unit calculates, for the node on the netlist corresponding to a predetermined coordinate, an emission amount of electrons according to a temporal change in a charged state accompanying the irradiation of the charged particle beam based on the pulsing condition. The compara-
(Continued)

tor compares a measurement result by the detector with a calculation result by the emission amount calculation unit.

10 Claims, 16 Drawing Sheets

(58) Field of Classification Search
USPC .............................. 250/306, 307, 310, 311
See application file for complete search history.

(56) References Cited

U.S. PATENT DOCUMENTS

| | | |
|---|---|---|
| 10,157,722 B2 | 12/2018 | Hatakeyama et al. |
| 2002/0130262 A1* | 9/2002 | Nakasuji ............... H01J 37/185 |
| | | 250/311 |
| 2003/0057971 A1 | 3/2003 | Nishiyama et al. |
| 2012/0091339 A1 | 4/2012 | Ominami et al. |
| 2014/0014848 A1 | 1/2014 | Hatakeyama et al. |
| 2016/0377561 A1* | 12/2016 | Ramachandran ............................ |
| | | G01N 21/95607 |
| | | 250/307 |

FOREIGN PATENT DOCUMENTS

| | | |
|---|---|---|
| TW | 201634917 A | 10/2016 |
| WO | 2013121110 A1 | 8/2013 |

\* cited by examiner

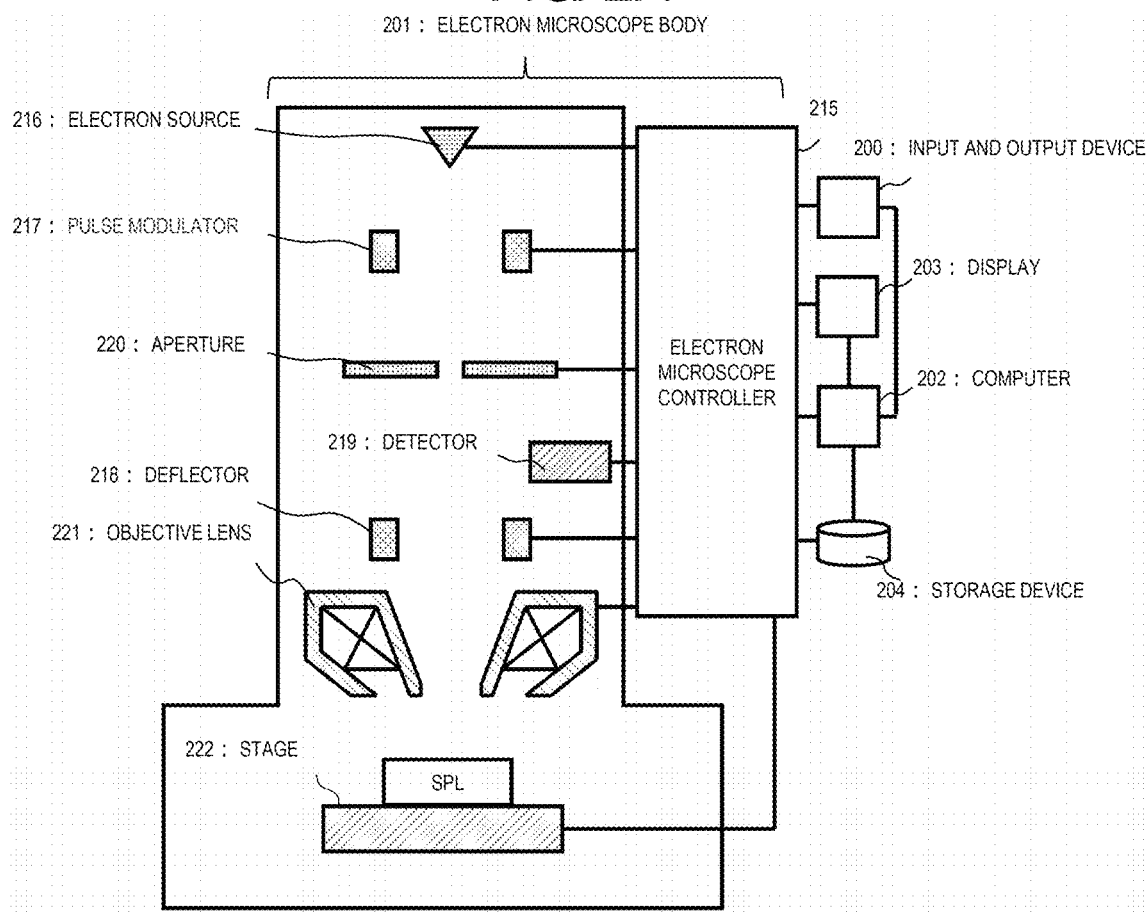

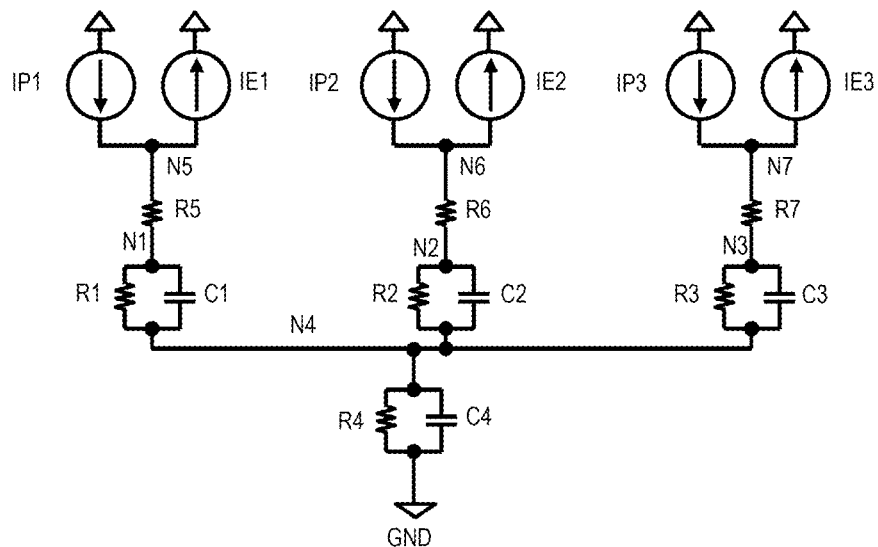

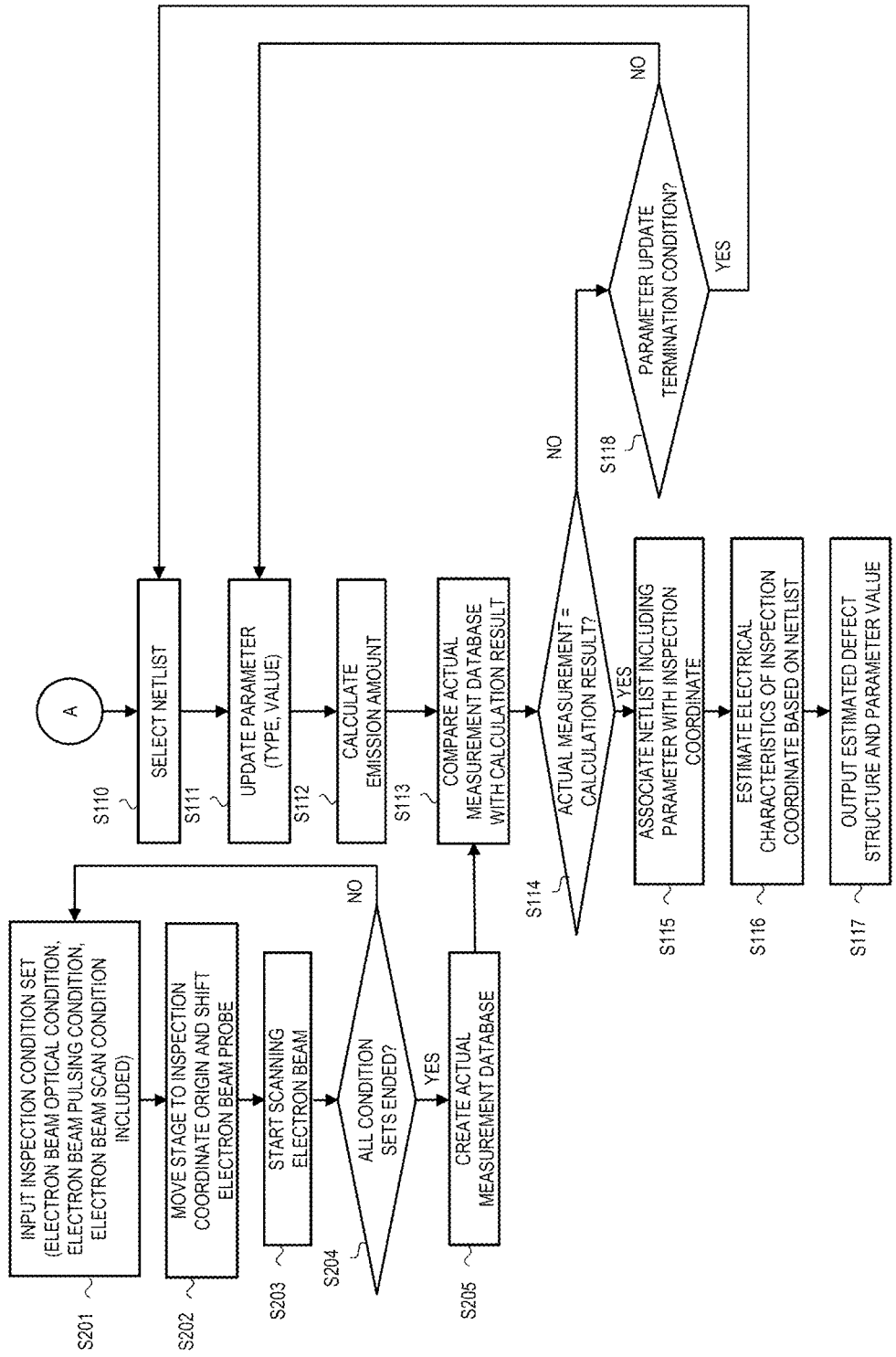

305b: CALCULATION NETLIST

```
<-- inserted from here -->
IP1 GND N5 I= f1(t)...
IP2 GND N6 I= f2(t)...
IP3 GND N7 I= f3(t)...
IE1 N5 GND I=g1(V(N5),V(N6)...) ...
IE2 N6 GND I=g2(V(N5),V(N6)...) ...
IE3 N7 GND I=g3(V(N5),V(N6)...) ...
<-- inserted to here -->

R1 N1 N4 R1var
C1 N1 N4 C2var
R2 N2 N4 R2var
C2 N2 N4 C2var
R3 N3 N4 10k
C3 N3 N4 1p
R4 N4 GND 10k
C4 N4 GND 1p
R5 N1 N5 10k
R6 N2 N6 10k
R7 N3 N7 10k
RDEF N2 N3 RDEFvar
```

209b: NETLIST (DEFECT STRUCTURE)

```
R1 N1 N4 10k
C1 N1 N4 1p
R2 N2 N4 10k
C1 N2 N4 1p
R3 N3 N4 10k
C1 N3 N4 1p
R4 N4 GND 10k
C4 N4 GND 1p
R5 N1 N5 10k
R6 N2 N6 10k
R7 N3 N7 10k
RDEF N2 N3 1k
```

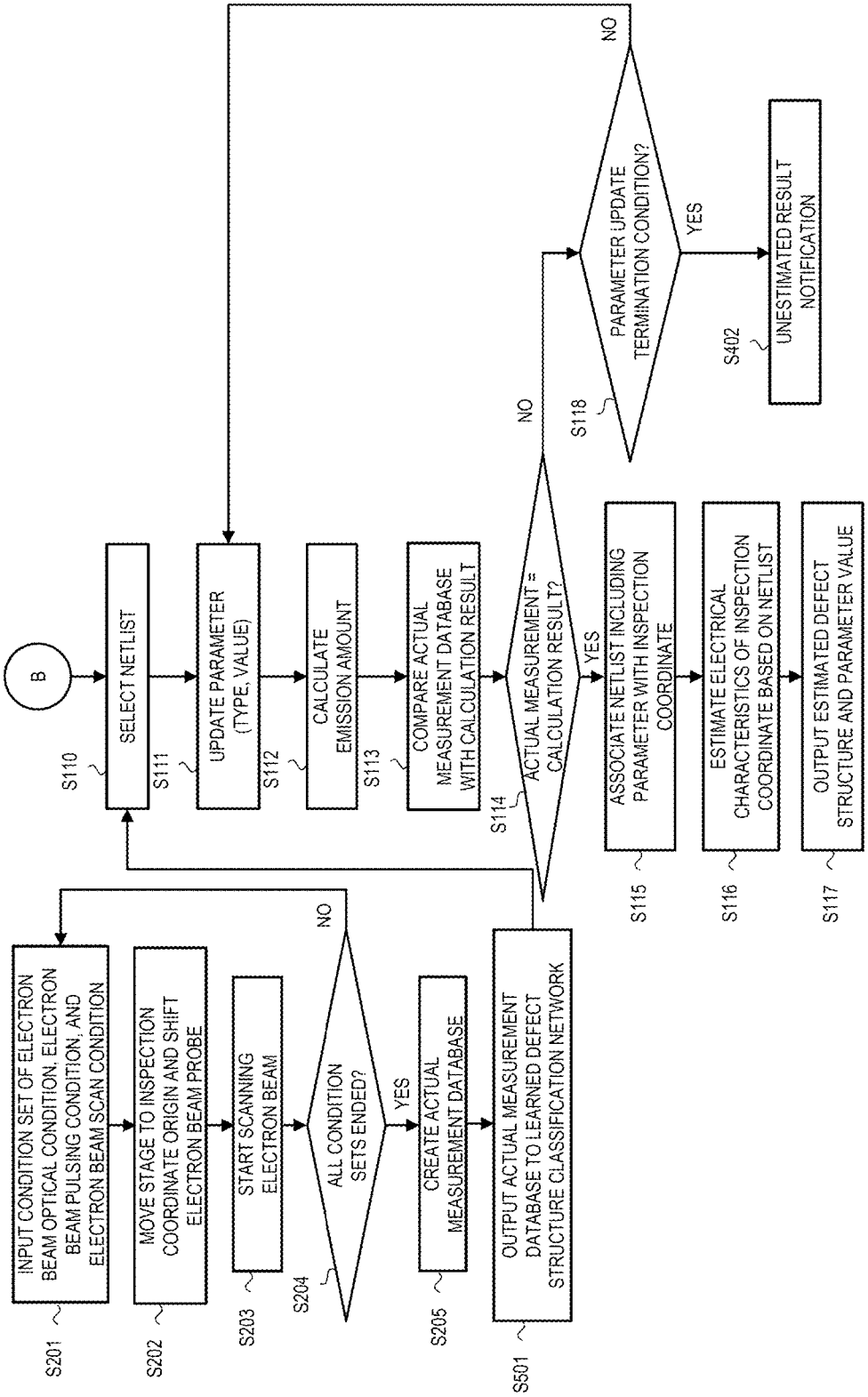

CHARGED PARTICLE BEAM APPARATUS AND CHARGED PARTICLE BEAM INSPECTION SYSTEM

BACKGROUND OF THE INVENTION

1. Field of the Invention

The present invention relates to a charged particle beam apparatus and a charged particle beam inspection system, and relates to a technique that estimates electrical characteristics of a sample using, for example, a charged particle beam.

2. Description of the Related Art

As one of sample analysis methods using an electron microscope, a method is known in which a potential contrast image is formed based on detection of secondary electrons or the like obtained by irradiating a sample with an electron beam and electrical characteristics of an element formed on the sample are evaluated based on an analysis of the potential contrast image.

JP-A-2003-100823 (Patent Literature 1) discloses a method of calculating an electric resistance value based on a potential contrast and determining a defect.

JP-A-2008-130582 (Patent Literature 2) discloses a method of accurately predicting characteristics of defects such as an electric resistance value by creating a netlist that describes information including electrical characteristics and connection information of a circuit element from a potential contrast as an equivalent circuit.

Patent Literatures 1 and 2 disclose methods of estimating a resistance value of a sample using a potential contrast. By using such methods, it is possible to estimate resistance characteristics of the sample. However, it is not easy to estimate capacitance characteristics of the sample. That is, in order to accurately estimate the capacitance characteristics, it is necessary to obtain information on temporal change (transient response) of a charge amount rather than a charge amount at a certain time point (steady state) accompanying electron beam irradiation.

SUMMARY OF THE INVENTION

The invention has been made in view of the above circumstances, and an object thereof is to provide a charged particle beam apparatus and a charged particle beam inspection system capable of estimating electrical characteristics of a sample including capacitance characteristics.

The above and other objects and novel features of the invention will become apparent from the description of this specification and the accompanying drawings.

An outline of a representative one of embodiments disclosed in the present application will be briefly described as follows.

A charged particle beam apparatus according to a representative embodiment of the invention estimates electrical characteristics of a sample by using a netlist representing an equivalent circuit of a device structure of a sample, correspondence data representing a correspondence relationship between a node of the netlist and a coordinate on the sample, and pulsing condition data that defines a pulsing condition when irradiating the sample with a charged particle beam in a pulsed manner. The charged particle beam apparatus includes a charged particle beam optical system, a detector, an emission amount calculation unit, and a comparator. The charged particle beam optical system irradiates a predetermined coordinate on the sample with a charged particle beam based on a pulsing condition. The detector actually measures an emission amount of electrons according to the irradiation of the charged particle beam by the charged particle beam optical system. The emission amount calculation unit calculates, for the node on the netlist corresponding to a predetermined coordinate, an emission amount of electrons according to a temporal change in a charged state accompanying the irradiation of the charged particle beam based on the pulsing condition. The comparator compares a measurement result by the detector with a calculation result by the emission amount calculation unit.

When an effect obtained by the representative embodiment of the invention disclosed in the present application is briefly described, the electrical characteristics of the sample including the capacitance characteristics can be estimated according to the charged particle beam apparatus.

BRIEF DESCRIPTION OF THE DRAWINGS

FIG. 2A is a schematic view showing a configuration example of a main part of the charged particle beam apparatus according to the first embodiment of the invention;

FIG. 3C is a circuit diagram showing an example of an equivalent circuit of the sample at the time of electron beam irradiation in FIG. 3A;

FIG. 3D is a diagram showing a configuration example of a netlist and a calculation netlist corresponding to the equivalent circuit of FIG. 3C;

FIG. 4B is a flowchart following FIG. 4A;

FIG. 10B is a flowchart following FIG. 10A.

DESCRIPTION OF THE PREFERRED EMBODIMENTS

In the following embodiments, when a number and the like (including the number of articles, a numeric value, a quantity, a range and the like) of an element is referred to, the embodiments are not limited to the specific number, and the number may be greater than, equal to, or less than the specific number, unless otherwise specified and except that the specific number is clearly limited to a specific number in principle. Further, in the embodiments described below, it is needless to say that constituent elements (including element steps) are not always indispensable unless otherwise stated and except that the constituent elements are apparently indispensable in principle. Similarly, in the following embodiments, shapes, position relationships, and the like of constituent elements and the like include those substantially approximate or similar to the shapes and the like unless otherwise particularly specified and except that it is considered to be not the case in principle. The same also applies to the numerical value and the range described above.

Hereinafter, embodiments of the invention will be described in detail with reference to the drawings. The same components are generally denoted by the same reference symbols throughout all the drawings for describing the embodiments, and the repetitive description thereof will be omitted.

First Embodiment

<Estimation Principle of Electrical Characteristics (Capacitance Characteristics)>

Figure 1:
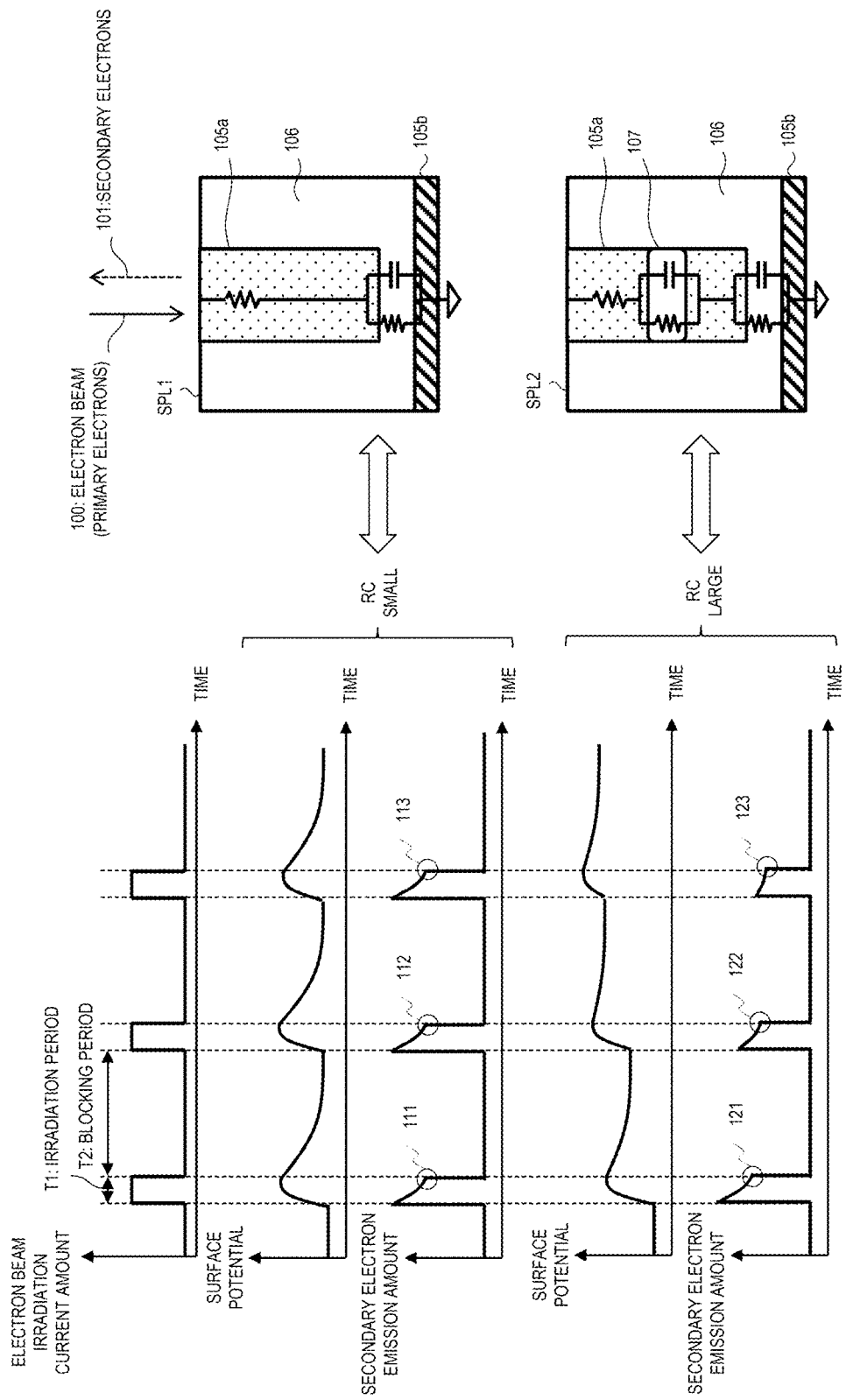
FIG. 1 is a diagram illustrating a detection principle of electric characteristics (capacitance characteristics) of a sample in a charged particle beam apparatus according to a first embodiment of the invention.

FIG. 1 is a diagram illustrating a detection principle of electric characteristics (capacitance characteristics) of a sample in a charged particle beam apparatus according to a first embodiment of the invention. In the example of FIG. 1, a sample SPL1 of a normal structure in which a conductor 105$a$ and a conductor 105$b$ are arranged with an insulator 106 sandwiched therebetween is irradiated with an electron beam (primary electrons) 100, and secondary electrons (or reflected electrons) 101 emitted in response to the electron beam are detected. An emission amount of the secondary electrons 101 decreases as a surface potential of the sample SPL1 generated by the irradiation of the electron beam 100 increases (as an accumulated charge amount increases). Similarly, the irradiation of the electron beam 100 and the detection of the secondary electrons 101 are also performed on a sample SPL2 of a defect structure including a defect 107.

In FIG. 1, the electron beam 100 is pulsed (modulated) by appropriately setting an irradiation period T1 and a blocking period T2, and the pulsed electron beam 100 is emitted to the sample SPL1 of the normal structure and the sample SPL2 of the defect structure. In this case, a temporal change (transient response) occurs in a charged state (surface potential) of each of the samples SPL1 and SPL2 in accordance with a resistance (parasitic resistance) R and a capacitance (parasitic capacitance) C in each of the samples SPL1 and SPL2.

In the case of the sample SPL1 of the normal structure in which values of the resistance R and the capacitance C are small, since a time constant is small, charges accumulated in the sample SPL1 accompanying previous irradiation with the electron beam 100 are sufficiently discharged before next irradiation with the electron beam 100. Therefore, the emission amount of the secondary electrons 101 is not particularly changed at each time of emitting the electron beam 100. On the other hand, in the case of the sample SPL2 of the defect structure in which the values of the resistance R and the capacitance C accompanying the defect 107 are large, since the time constant is large, next irradiation is performed before charges accumulated in the sample SPL2 accompanying the previous irradiation are sufficiently discharged. As a result, the emission amount of the secondary electrons 101 decreases each time the electron beam 100 is emitted.

Therefore, for example, a sum of a secondary electron emission amount obtained at each sampling point 121, 122, 123 in the sample SPL2 of a defect structure is smaller than a sum of the secondary electron emission amount obtained at each sampling point 111, 112, 113 in the sample SPL1 of the normal structure. In this manner, the time constant associated with the capacitance C can be acquired by detecting the emission amount of the secondary electrons 101 in accordance with the temporal change in the charged state (surface potential) by using the pulsed electron beam 100. Then, the electrical characteristics including the capacitance characteristics of the samples SPL1 and SPL2 can be estimated based on the acquired time constant.

Various other methods can be used as the method of actually measuring the emission amount of the secondary electrons 101 according to the temporal change in the charged state. For example, a sampling point may be set at a place other than an end point of the irradiation period T1. Here, a sum of the secondary electron emission amount obtained for each of a plurality of irradiations is set as a final measured value of the secondary electron emission amount, and the final measured value is not limited to the sum and may be a value proportional to the sum. For example, a value proportional to the sum described in FIG. 1 may be obtained using the secondary electron emission amount (sampling points 113, 123) detected at an Nth time of N irradiations or a sum of the secondary electron emission amount detected in a predetermined M (<N) times of N irradiations (for example, the sum of the sampling points 121 and 123).

Regarding a pulsing (modulation) method of the electron beam 100, for example, when the sample SPL1 in FIG. 1 is scanned with the electron beam 100 at a constant speed in a right direction, a predetermined period is required from a point when the electron beam 100 reaches a left end of the conductor 105$a$ to a point when the electron beam 100 exceeds a right end of the conductor 105$a$. In this case, a plurality of irradiation periods T1 and blocking periods T2 of the electron beam 100 as shown in FIG. 1 may be provided in the predetermined period. Alternatively, for example, in a state in which a scan region of the electron beam 100 is reduced to some extent, it is also possible to use a method in which the conductor 105$a$ is irradiated with the electron beam 100 at a predetermined time interval with the irradiation of the electron beam 100 to other places sandwiched therebetween. Further, a method of temporarily stopping the scanning and irradiating the same place may be used.

<Configuration of Charged Particle Beam Apparatus>

Figure 2B:
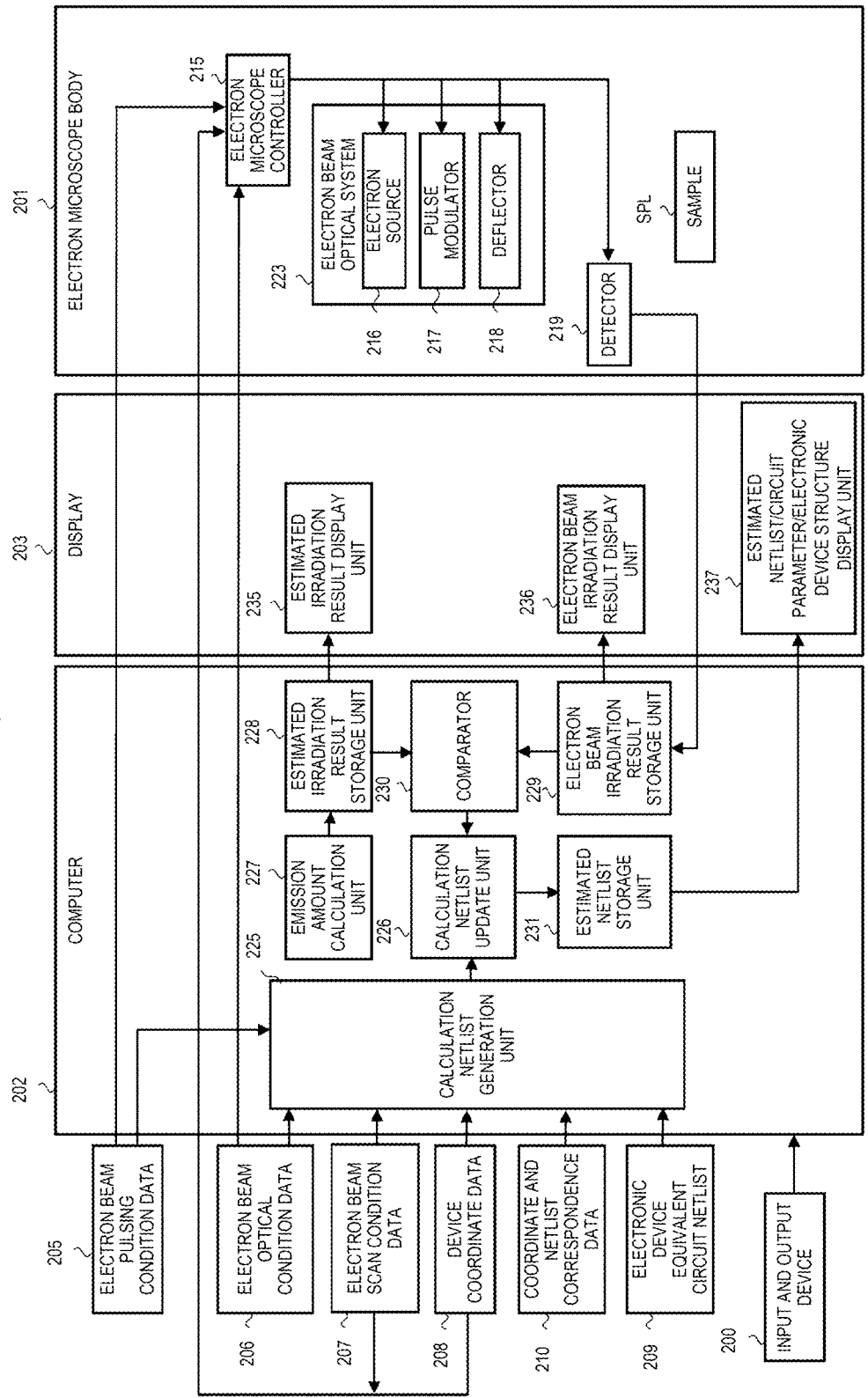
FIG. 2B is a schematic view showing a configuration example of a main part around a computer and a display in FIG. 2A.

FIG. 2A is a schematic view showing a configuration example of a main part of the charged particle beam apparatus according to the first embodiment of the invention. FIG. 2B is a schematic view showing a configuration example of a main part around a computer and a display in FIG. 2A. In the specification, the charged particle beam apparatus is an electron microscope apparatus using an electron beam as an example, but the invention is not limited thereto, and may be, for example, an ion microscope apparatus using an ion beam. The charged particle beam apparatus shown in FIG. 2A includes an electron microscope body 201, a computer 202, a display 203, a storage device 204, and an input and output device 200. The input and output device 200 is, for example, a user interface such as a keyboard or a mouse.

The electron microscope body 201 includes an electron source 216, pulse modulators 217, deflectors 218, a detector 219, apertures 220, objective lenses 221, a stage 222, and an electron microscope controller 215 that controls the above components. A sample SPL is mounted on the stage 222. The pulse modulators 217 pulse (modulate) an electron beam (charged particle beam) from the electron source 216 based on a predetermined pulsing condition, and irradiate the sample SPL with the electron beam. The deflectors 218 scan the sample SPL with the electron beam. The detector 219 actually measures an emission amount of electrons (secondary electrons, reflected electrons) from the sample SPL in response to the irradiation of the electron beam.

FIG. 2B shows the electron microscope controller 215, the electron source 216, the pulse modulator 217, the deflector 218, and the detector 219 shown in FIG. 2A as the electron microscope body 201. The electron source 216, the pulse modulator 217, the deflector 218, and the like are referred to as an electron beam optical system (charged particle beam optical system) 223. The electron beam optical system 223 irradiates a predetermined coordinate on the sample SPL with an electron beam based on a pulsing condition. The detector 219 actually measures the emission amount of electrons according to the irradiation of the electron beam by the electron beam optical system 223.

Here, for example, the storage device 204 of FIG. 2A stores electron beam pulsing condition data 205, electron beam optical condition data 206, electron beam scan condition data 207, device coordinate data 208, a netlist 209, and coordinate and netlist correspondence data 210. These data may be input by a user via the input and output device 200. The device coordinate data 208 sets a coordinate on the sample SPL. The netlist 209 represents an equivalent circuit of a device structure of the sample SPL. The coordinate and netlist correspondence data 210 represents a correspondence between nodes of the netlist 209 and coordinates on the sample SPL (coordinates on a chip layout).

Examples of the electron beam optical condition data 206 include an acceleration voltage, a retarding voltage, an irradiation current (probe current), a scan speed, a scan interval, a magnification, an opening angle, and a working distance. Although not shown, the retarding voltage is a voltage for decelerating the speed of the electron beam immediately before the sample SPL by applying a voltage to the sample SPL. The electron beam scan condition data 207 defines, for example, a scan range on a plane of the sample SPL and a method of moving the electron beam in the scan range (for example, in a right direction, a left direction, an upward direction, and a downward direction). That is, the electron beam scan condition data 207 defines at which time point and at what coordinate the probe current is focused (however, the probe current is focused but is not necessarily irradiated).

The electron beam pulsing condition data (electron beam modulation condition data) 205 defines a pulsing condition when the sample SPL is irradiated with an electron beam in a pulsed manner, and determines from what time point and for what period the electron beam irradiation is turned on in a predetermined control period. That is, the electron beam pulsing condition data 205 determines whether or not the irradiation is actually performed at a focused destination based on the electron beam scan condition data 207. Specific examples of the electron beam pulsing condition data 205 include an ON pulse period, a duty ratio (=ON pulse period/control period), and a frequency (=1/control period). The ON pulse period corresponds to the irradiation period T1 in FIG. 1. Further, the electron beam pulsing condition data 205 may include a condition in which the ON pulse period and the duty ratio are sequentially changed in time series.

The electron microscope controller 215 in the electron microscope body 201 controls the electron beam optical system 223 based on the electron beam pulsing condition data 205, the electron beam optical condition data 206, the electron beam scan condition data 207, and the device coordinate data 208. The electron microscope controller 215 controls the detector 219 in synchronization with the control of the electron beam optical system 223. For example, as shown in FIG. 1, the electron microscope controller 215 controls the detector 219 to be activated in the irradiation period T1 of the electron beam 100 to the sample SPL.

The computer 202 includes a computer system including, for example, a Central Processing Unit (CPU). The computer 202 includes a calculation netlist generation unit 225, a calculation netlist update unit 226, an emission amount calculation unit 227, an estimated irradiation result storage unit 228, an electron beam irradiation result storage unit 229, a comparator 230, and an estimated netlist storage unit 231. For example, each storage unit (228, 229, 231) is implemented by a volatile memory or a non-volatile memory in the computer 202, the storage device 204 of FIG. 2A, and the like, and each processing unit (225, 226, 227, 230) is implemented by program processing by the CPU or the like.

Here, for example, it is assumed that the electron beam optical system 223 irradiates the predetermined coordinate on the sample SPL with an electron beam based on the pulsing condition. In this case, based on the coordinate and netlist correspondence data 210, the calculation netlist generation unit 225 adds a circuit element (for example, a variable current source) that reflects the irradiation of the electron beam to the node on the netlist 209 corresponding to the predetermined coordinate. In addition, the calculation netlist generation unit 225 adds a circuit element (for example, a variable current source) indicating the emission amount of the secondary electrons to the node on the netlist 209 corresponding to the predetermined coordinate.

At this time, the emission amount of the secondary electrons is affected by the temporal change in the charged state (surface potential) accompanying the irradiation of the electron beam as described in FIG. 1. Accordingly, the influence of the temporal change in the charged state is also reflected in the circuit element representing the emission amount of the secondary electrons. In this manner, the calculation netlist generation unit 225 generates a calculation netlist reflecting the irradiation of the electron beam and the emission amount of the secondary electrons with respect to the netlist 209.

The calculation netlist update unit 226 updates the calculation netlist by sequentially changing an element parameter value (for example, a resistance value or a capacitance value) in the calculation netlist with respect to the calculation netlist generated by the calculation netlist generation unit 225. This update is performed until a matching comparison result is obtained by the comparator 230. The emission amount calculation unit 227 calculates the emission amount of the secondary electrons using the calculation netlist updated by the calculation netlist update unit 226. That is, for the node on the netlist corresponding to the above-mentioned predetermined coordinate, the emission amount calculation unit 227 calculates the emission amount of electrons according to the temporal change in the charged state accompanying the irradiation of the charged particle beam based on the pulsing condition.

The estimated irradiation result storage unit 228 stores a calculation result by the emission amount calculation unit 227. The calculation result is the electron emission amount according to the temporal change in the charged state, and corresponds to, for example, the sum of the sampling points 111, 112, 113 in the example of FIG. 1. However, the calculation result stored in the estimated irradiation result storage unit 228 is not limited to such an electron emission amount itself, and may be obtained by converting the emission amount of the electrons into a secondary electron image (potential contrast image).

The electron beam irradiation result storage unit 229 stores a measurement result by the detector 219 in the electron microscope body 201. Similar to the case of the estimated irradiation result storage unit 228, the measurement result is the emission amount of electrons according to the temporal change in the charged state, and corresponds to, for example, the sum of the sampling points 111, 112, 113 in the example of FIG. 1. However, similar to the case of the estimated irradiation result storage unit 228, the calculation result stored in the electron beam irradiation result storage unit 229 is not limited to the emission amount of the electrons itself, and may be obtained by converting the emission amount of the electrons into a secondary electron image (potential contrast image).

The comparator 230 compares the calculation result stored in the estimated irradiation result storage unit 228 (that is, the calculation result by the emission amount calculation unit 227) and the measurement result stored in the electron beam irradiation result storage unit 229 (that is, the measurement result by the detector 219). Here, when a mismatching comparison result is obtained by the comparator 230, the element parameter value in the calculation netlist is updated by the calculation netlist update unit 226, and the above-described processing from the emission amount calculation unit 227 to the comparator 230 is performed again using the updated calculation netlist. On the other hand, when a matching comparison result is obtained by the comparator 230, the calculation netlist update unit 226 stores the netlist including the current element parameter value in the estimated netlist storage unit 231 as an estimated netlist.

The display 203 includes an estimated irradiation result display unit 235, an electron beam irradiation result display unit 236, and an estimated netlist/circuit parameter/electronic device structure display unit 237. The estimated irradiation result display unit 235 displays the calculation result stored in the estimated irradiation result storage unit 228 regardless of the matching/mismatching of the comparison result by the comparator 230. Similarly, the electron beam irradiation result display unit 236 displays the measurement result stored in the electron beam irradiation result storage unit 229 regardless of the matching/mismatching of the comparison result by the comparator 230. The estimated netlist/circuit parameter/electronic device structure display unit 237 displays the estimated netlist stored in the estimated netlist storage unit 231 when the comparison result by the comparator 230 matches, and the circuit parameter and the device structure corresponding thereto.

<Netlist and Calculation Netlist>

Figure 3A:
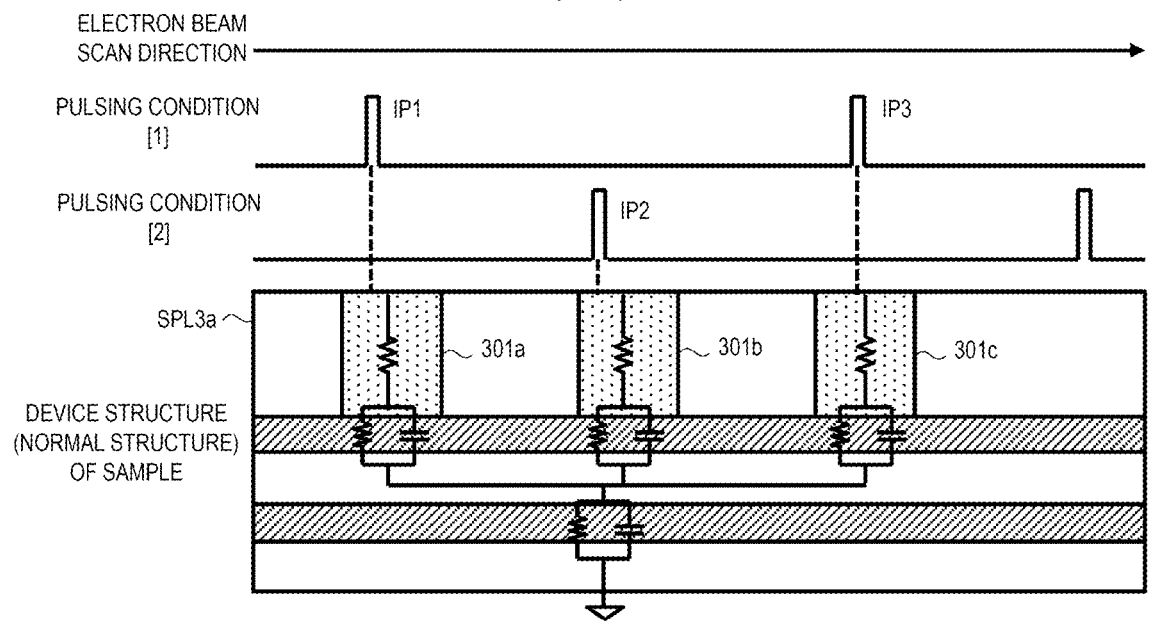
FIG. 3A is a diagram showing an example of a situation when a sample is irradiated with an electron beam based on a pulsing condition in FIG. 2B.
Figure 3B:
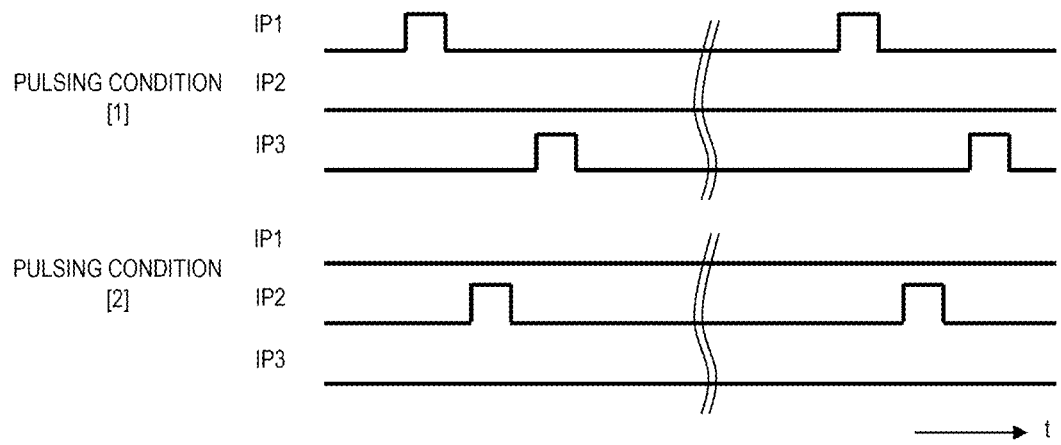
FIG. 3B is a waveform diagram showing an example of each probe current in FIG. 3A.

FIG. 3A is a diagram showing an example of a situation when the sample is irradiated with the electron beam based on the pulsing condition in FIG. 2B. FIG. 3B is a waveform diagram showing an example of each probe current in FIG. 3A. FIG. 3C is a circuit diagram showing an example of an equivalent circuit of the sample at the time of electron beam irradiation in FIG. 3A. FIG. 3D is a diagram showing a configuration example of a netlist and a calculation netlist corresponding to the equivalent circuit of FIG. 3C.

FIG. 3A shows an example of a device structure (normal structure) of a sample SPL3$a$ having three contact plugs 301$a$, 301$b$, and 301$c$. Such a device structure can be expressed by an equivalent circuit including resistance and capacitance. Then, the electron beam is emitted to the sample SPL3$a$ based on the electron beam pulsing condition data 205 and the like in FIG. 2B. In this example, a plurality of pulsing conditions [1], [2] are defined.

Under the pulsing condition [1], the contact plug 301$a$ and the contact plug 301$c$ are sequentially irradiated with the electron beam in a scan direction of the electron beam. Under the pulsing condition [2], the contact plug 301$b$ and a member (for example, a contact plug (not shown)) ahead of the contact plug 301$b$ are sequentially irradiated with the electron beam in the scan direction of the electron beam. The emitted electron beams are expressed by probe current sources IP1, IP2, and IP3.

For example, the probe current source IP1 is a current source corresponding to the contact plug 301$a$, and the probe current source IP2 is a current source corresponding to the contact plug 301$b$. When viewed on a time axis, the probe current sources IP1, IP2, and IP3 have a characteristic of injecting a current at a predetermined time interval for a predetermined period as shown in FIG. 3B based on the electron beam pulsing condition data 205 and the electron beam scan condition data 207 (that is, the method of moving the electron beam) in FIG. 2B.

Based on FIGS. 3A and 3B, an equivalent circuit as shown in FIG. 3C can be created. In FIG. 3C, nodes N5, N6, N7 correspond to surface positions of the contact plugs 301$a$, 301$b$, 301$c$ of FIG. 3A. For example, the probe current source IP1 representing electron beam irradiation is connected between the node N5 and a ground potential GND. An emission current source IE1 representing an emission amount of the secondary electrons (reflected electrons) accompanying the electron beam irradiation is connected between the node N5 and the ground potential GND.

Characteristics of the emission current source IE1 are defined based on, for example, a predetermined secondary electron emission model. At this time, the emission amount of the secondary electrons changes under the influence of the charged state (for example, the surface potential of the node N5) accompanying the electron beam irradiation. Therefore, the characteristic of the emission current source IE1 is defined as a function of such a surface potential.

Here, for example, it is assumed that an electron beam is emitted to the contact plug 301$a$ of FIG. 3A. In this case, in FIG. 3C, the probe current source IP1 is in an active state, a probe current is injected into the node N5, and the probe current sources IP2 and IP3 are in an inactive state (for example, an open state). In this state, the surface potential (for example, the potential of the node N5) is defined, and an emission current from the emission current source IE1 is defined according to the surface potential. The emission current from the emission current source IE1 corresponds to the emission amount of the secondary electrons actually measured by the detector 219 of FIG. 2B.

FIG. 3D shows an example of the netlist 209 in FIG. 2B and an example of the calculation netlist generated by the calculation netlist generation unit 225. A netlist 209a in FIG. 3D represents a circuit in which the probe current sources IP1, IP2, and IP3 and the emission current sources IE1, IE2, and IE3 are omitted from the equivalent circuit of FIG. 3C, and represents each circuit element that constitutes the circuit and a connection relationship between circuit elements as a list. In the netlist 209a, for example, a resistance element R1 of 10 kΩ is connected between a node N1 and a node N4. The netlist 209a is generated in advance based on the device structure or the like of the sample SPL3a as shown in FIG. 3A.

The calculation netlist generation unit 225 of FIG. 2B generates a calculation netlist 305a as illustrated in FIG. 3D by adding the probe current sources IP1, IP2, and IP3 and the emission current sources IE1, IE2, and IE3 as shown in FIG. 3C to the netlist 209a. For example, the probe current source IP1 is connected between the ground potential GND and the node N5, and is defined as a function expression "f1($t$)" at time t as shown in FIG. 3B. The function expression is described in a description language of a simulator.

The emission current source IE1 is connected between the node N5 and the ground potential GND, and is defined as a function expression "g1(V(N5), V(N6), ... )" of the surface potential (for example, the potential V(N5) of the node N5, the potential V(N6) of the node N6, ... ). Here, the emission amount of the secondary electrons is usually changed under the influence of the surface potential in a predetermined region. Therefore, the emission current source IE1 may be a function of only the potential V(N5) of the node N5. Here, assuming that the nodes N5, N6, . . . are included in the predetermined region, the function includes the potential V(N6) of the node N6 and the like.

Further, the calculation netlist generation unit 225 of FIG. 2B defines, as a variable, a predetermined element parameter included in the calculation netlist 305a based on, for example, a designation from the user via the input and output device 200. In the example of FIG. 3D, the resistance elements R1 and R2 and the capacitance elements C1 and C2 are defined as variables. The user designates a variable and also designates a variable setting range of a variable value. Based on such user designation, the calculation netlist update unit 226 in FIG. 2B sequentially causes the emission amount calculation unit 227 to calculate emission current values of the emission current sources IE1, IE2, and IE3 in the calculation netlist 305a while changing the variable value of the designated variable.

<Operation of Charged Particle Beam Apparatus>

Figure 4A:
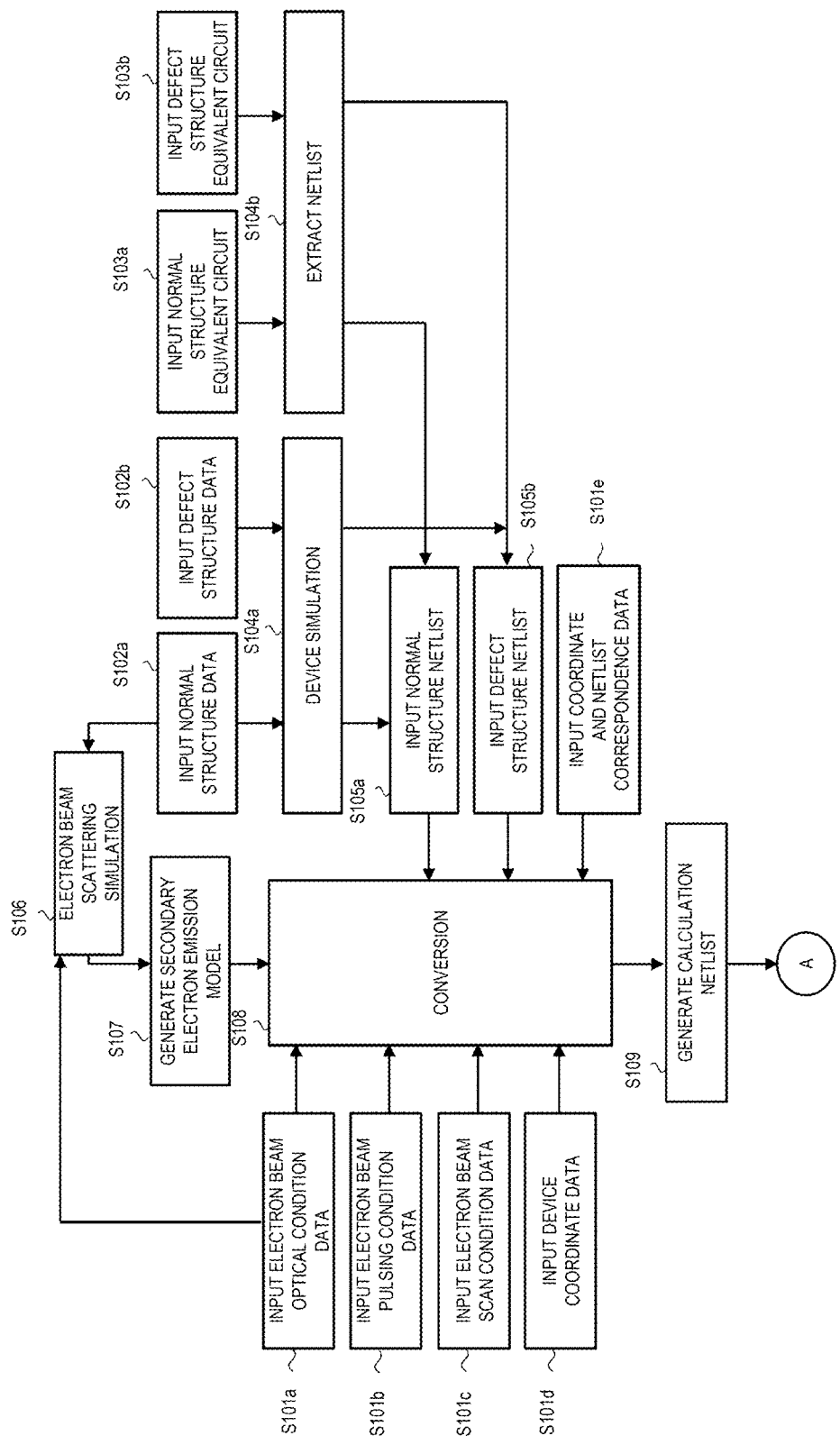
FIG. 4A is a flowchart showing an operation example of the charged particle beam apparatus of FIG. 2B.

FIG. 4A is a flowchart showing an operation example of the charged particle beam apparatus of FIG. 2B, and FIG. 4B is a flowchart following FIG. 4A. In steps S101a to S101e of FIG. 4A, as described with reference to FIG. 2B, the electron beam optical condition data 206, the electron beam pulsing condition data 205, the electron beam scan condition data 207, the device coordinate data 208, and the coordinate and netlist correspondence data 210 are input to the calculation netlist generation unit 225. In steps S105a and S105b, the netlist 209 is input to the calculation netlist generation unit 225.

Various types of data input in steps S101a to S101d are stored, for example, in the storage device 204 of FIG. 2A as an inspection recipe in advance. Regarding the netlist 209, as shown in steps S105a and S105b, a netlist of a normal structure and a netlist of a defect structure reflecting a predetermined defect are input. Then, the coordinate and netlist correspondence data 210 is generated automatically or manually so as to correspond to the netlist, and the data is input to the calculation netlist generation unit 225 in step S101e.

Figure 5A:
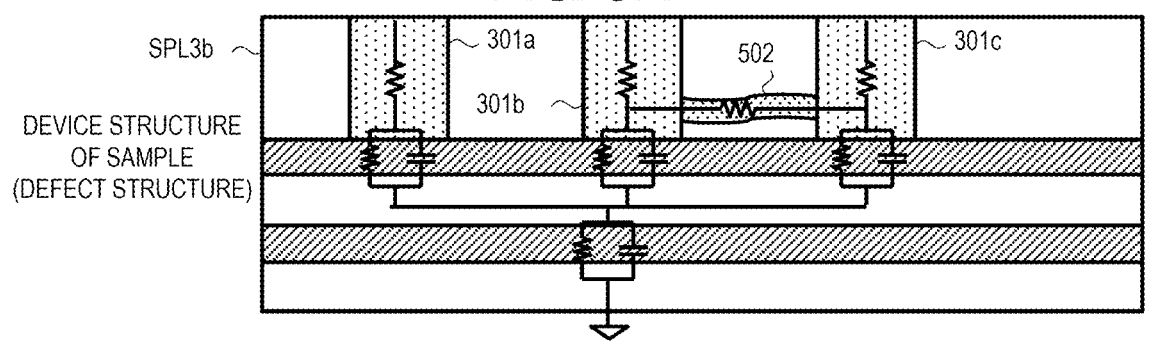
FIG. 5A is a diagram showing an example of a device structure corresponding to a netlist of a defect structure in FIG. 4A.
Figure 5B:
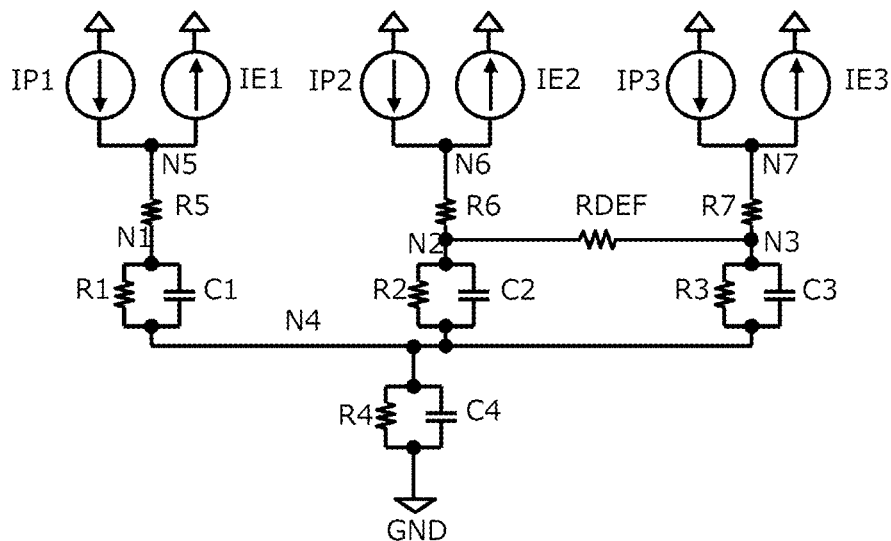
FIG. 5B is a circuit diagram showing an example of an equivalent circuit of a calculation netlist corresponding to the device structure of FIG. 5A.
Figure 5C:
FIG. 5C is a diagram showing a configuration example of the calculation netlist corresponding to the equivalent circuit of FIG. 5B and a configuration example of a netlist of a defect structure that is a source thereof.

FIG. 5A is a diagram showing an example of a device structure corresponding to the netlist of the defect structure in FIG. 4A. FIG. 5B is a circuit diagram showing an example of an equivalent circuit of a calculation netlist corresponding to the device structure of FIG. 5A. FIG. 5C is a diagram showing a configuration example of the calculation netlist corresponding to the equivalent circuit of FIG. 5B and a configuration example of the netlist of the defect structure that is a source thereof. In a sample SPL3b of the defect structure shown in FIG. 5A, for example, as compared with the sample SPL3a of the normal structure shown in FIG. 3A, a defect 502 of a conductor exists between the contact plugs 301b and 301c.

The equivalent circuit shown in FIG. 5B includes a resistance element RDEF reflecting the defect 502 of FIG. 5A. In a netlist 209b having the defect structure and a calculation netlist 305b shown in FIG. 5C, the resistance element RDEF is added between the node N2 and the node N3 as compared with the netlist 209a having the normal structure and the calculation netlist 305a shown in FIG. 3D. Since a resistance value of the resistance element RDEF can take various values depending on a shape, a material or the like of the defect 502, the resistance element RDEF is set to a variable in the calculation netlist 305b of FIG. 5C. In this way, a netlist of one or a plurality of defect structures reflecting the defect is created in advance for each position (and type (capacitance, resistance, and the like)) of the defect that is assumed in advance.

Returning to FIG. 4A, when the netlists of the normal structure and the defect structure are created (steps S105a and S105b), two methods are mainly considered. As shown in steps S102a, S102b, and S104a, the first method is creating a netlist by device simulation using the device structure of the normal structure as shown in FIG. 3A or the device structure of the defect structure as shown in FIG. 5A as input. As shown in steps S103a, S103b, and S104b, the second method is extracting a netlist (for example, the netlist 209a in FIG. 3D) using a predetermined tool by using the equivalent circuit of the normal structure (for example, the equivalent circuit corresponding to the netlist 209a in FIG. 3D) or the equivalent circuit of the defect structure which are created by the user as input. A method of directly creating a netlist may be used by the user.

As described with reference to FIG. 3C and the like, in order to generate the emission current sources IE1 to IE3, a secondary electron emission model is required. In the example of FIG. 4A, as shown in steps S106 and S107, a secondary electron emission model depending on the surface potential is generated by inputting the device structure of the normal structure in step S102a and the electron beam optical condition data (mainly the acceleration voltage and the like) in step S101a to an electron beam scattering simulation (charged particle beam scattering simulation). Accordingly, the emission amount calculation unit 227 in FIG. 2B calculates the emission amount of the secondary electrons using the secondary electron emission model based on the electron beam scattering simulation.

Instead of the method of using the electron beam scattering simulation, for example, a method of selecting from a list of electron beam scattering models constituted by a plurality of calculation formulas prepared in advance, a method of performing electromagnetic field simulation on structure data, and a method of combining the above two methods may be used.

Using the various types of data input in steps S101a to S101e and the secondary electron emission model generated in step S107, the calculation netlist generation unit 225 of FIG. 2B performs, for example, various types of conversion processing such as associating a coordinate and timing at which the electron beam is emitted with nodes of a netlist (step S108). Then, the calculation netlist generation unit 225 generates the calculation netlist 305a corresponding to the normal structure illustrated in FIG. 3D and the calculation netlist 305b corresponding to the defect structure illustrated in FIG. 5C (step S109).

Subsequently, in FIG. 4B, the calculation netlist update unit 226 of FIG. 2B selects one calculation netlist from a plurality of calculation netlists that may be generated by the calculation netlist generation unit 225 (step S110). In this case, options of the calculation netlists include those having the normal structure and those having the defect structure. That is, although the equivalent circuit has a normal structure, an element parameter value on the equivalent circuit may be abnormal, or the assumed equivalent circuit itself may change due to a defect.

Next, as described with reference to FIG. 3D, the calculation netlist update unit 226 sets, for the selected calculation netlist, an element parameter value among element parameters defined as variables to an initial value as described in FIG. 3D (step S111). The emission amount calculation unit 227 in FIG. 2B calculates (simulates) the emission amount of the secondary electrons (for example, emission current values of the emission current sources IE1 to IE3 in FIG. 3C) to the calculation netlist including the element parameter value defined in this manner (step S112).

On the other hand, in step S201 of FIG. 4B, an inspection condition set including the electron beam optical condition data 206, the electron beam pulsing condition data 205, and the electron beam scan condition data 207 is input to the electron microscope body 201 of FIG. 2B. The data in the inspection condition set and the data input in steps S101a, S101b, and S101c in FIG. 4A are the same since the same precondition needs to be used for actual measurement by the electron microscope body 201 and calculation by the emission amount calculation unit 227.

In step S202, the electron microscope body 201 moves the stage 222 to an inspection coordinate origin or shifts an electron beam probe based on the device coordinate data 208 of FIG. 2B. Thereafter, the electron microscope body 201 performs actual measurement using the detector 219 while scanning the sample SPL with the electron beam based on the condition input in step S201 (step S203).

Subsequently, in step S204, the electron microscope body 201 repeats the processing of steps S201 to S203 until the actual measurement under all inspection condition sets ends. That is, in the example, a plurality of inspection condition sets are provided as the inspection condition set in step S201. In particular, each inspection condition set is different in a pulsing condition defined by the electron beam pulsing condition data 205. Specifically, in the pulsing condition data, a plurality of pulsing conditions different in the ON pulse period (corresponding to the irradiation period T1 in FIG. 1) or the duty ratio (corresponding to the irradiation period T1/(irradiation period T1+blocking period T2) in FIG. 1) are defined.

In the process of repeating the processing of steps S201 to S203, the electron beam optical system 223 of FIG. 2B emits the electron beam for each of the plurality of pulsing conditions, and the detector 219 also actually measures the emission amount of the secondary electrons for each of the plurality of pulsing conditions. Through the processing of steps S201 to S203, the computer 202 creates an actual measurement database that represents an actual measurement result of each inspection condition set (in particular, for each pulsing condition) by the electron microscope body 201, and stores the actual measurement database in the electron beam irradiation result storage unit 229 (step S205).

On the other hand, in step S109, the calculation netlist generation unit 225 of FIG. 2B also generates a plurality of calculation netlists corresponding to the plurality of inspection condition sets. In step S112, the emission amount calculation unit 227 of FIG. 2B also calculates the emission amount of the secondary electrons for each of the plurality of inspection condition sets (in particular, for each pulsing condition) under the condition that the electron beam is emitted for each of the plurality of inspection condition sets (in particular, for each pulsing condition).

Thereafter, in step S113, the comparator 230 of FIG. 2B compares the actual measurement database created in step S205 with the calculation result in step S112. That is, the comparator 230 compares the actual measurement result of each of the plurality of pulsing conditions by the detector 219 with the calculation result of each of the plurality of pulsing conditions by the emission amount calculation unit 227. At this time, if similarity between the characteristics of the actual measurement result for each of the plurality of pulsing conditions and the characteristics of the calculation result for each of the plurality of pulsing conditions is equal to or greater than a certain level, a comparison result is regarded as matching.

If the comparison result in step S113 does not match ("NO" in step S114), the calculation netlist update unit 226 determines whether or not a termination condition of parameter update is satisfied (step S118). If the termination condition is not satisfied, the calculation netlist update unit 226 returns to step S111 to change the type of the element parameter or to change the element parameter value and maintains the type of the element parameter. On the other hand, when the termination condition is satisfied, the calculation netlist update unit 226 returns to step S110 and selects another calculation netlist (for example, a calculation netlist of the defect structure having a defect place different from the last time).

With the above loop processing, in step S112, the emission amount calculation unit 227 calculates the emission amount of secondary electrons while changing the plurality of calculation netlists and the element parameter values included in the plurality of calculation netlists. The case where the termination condition for parameter update is satisfied in step S118 is, for example, when a variable setting range of the element parameter used as a variable is completely covered, or when the number of loops returning to step S111 reaches a predetermined upper limit number.

On the other hand, when the comparison result in step S113 matches ("YES" in step S114), the netlist including the element parameter value at that time point is stored in the estimated netlist storage unit 231 of FIG. 2B. The computer 202 of FIG. 2B associates the netlist with the inspection coordinate (step S115), and estimates the electrical characteristics including the capacitance characteristics in the inspection coordinate based on the type of the netlist (normal structure, defect structure) and the element parameter value in the netlist (step S116). Then, the computer 202 outputs the estimated defect structure, the element parameter value, and the like to the display 203 or the like (step S117).

In the example, in step S112, the emission amount calculation unit 227 calculates the emission amount of the secondary electrons while sequentially changing the plurality of calculation netlists and the element parameter values included in the plurality of calculation netlists until a matching comparison result is obtained by the comparator 230. On the other hand, regardless of the matching/mismatching of the comparison result, a method may be used in which the emission amount calculation unit 227 performs the calculation while sequentially changing the netlist and the element parameter value in advance, and registers the correspondence between the calculation result and the netlist and the element parameter value in advance as a calculation database. In this case, the comparator 230 may search for a calculation result closest to the actual measurement result in the actual measurement database obtained in step S205 from the calculation database, and acquire the netlist and the element parameter value corresponding to the calculation result.

<Details of Calculation Netlist Generation Unit>

Figure 6:
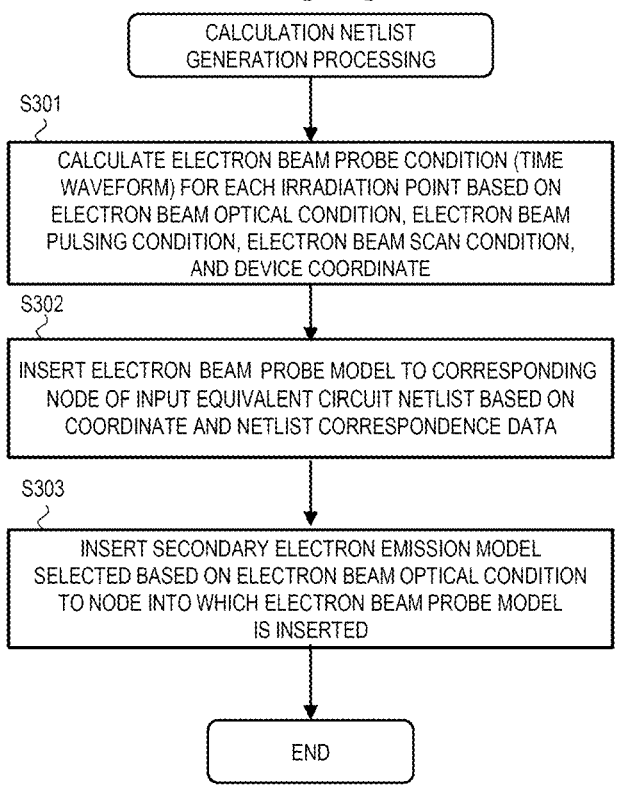
FIG. 6 is a flowchart showing an example of a processing content of a calculation netlist generation unit in FIG. 2B.

FIG. 6 is a flowchart showing an example of a processing content of the calculation netlist generation unit in FIG. 2B. In step S301 of FIG. 6, the calculation netlist generation unit 225 calculates an electron beam probe condition (time waveform) for each irradiation point based on the electron beam optical condition data 206, the electron beam pulsing condition data 205, the electron beam scan condition data 207, and the device coordinate data 208.

As a specific example, a current value of the probe current is determined based on an irradiation current (probe current) in the electron beam optical condition data 206. Further, based on the electron beam scan condition data 207 (and a scan speed in the electron beam optical condition data 206), it is determined at what time point and at what coordinate the probe current is focused. Further, based on the electron beam pulsing condition data 205, it is determined from what time point and for what period the probe current is actually emitted. Thus, the electron beam probe condition can be calculated for each coordinate on the sample SPL. The electron beam probe condition is a condition that determines what amount of probe current is emitted from what time point and for what period, and includes a time interval from the previous irradiation time point to the next irradiation time point.

Subsequently, in step S302, the calculation netlist generation unit 225, based on the correspondence between each irradiation point coordinate and the electron beam probe condition calculated in step S301, and the coordinate and netlist correspondence data 210, can obtain a correspondence between the nodes of the netlist and the electron beam probe conditions. The calculation netlist generation unit 225 inserts an electron beam probe model (that is, the probe current sources IP1 to IP3 of FIG. 3C, and the like) corresponding to the electron beam probe condition to the nodes of the netlist based on the correspondence. The model is not limited to a function expression indicating a periodic waveform as shown in FIG. 3D, and may be a format such as a data string.

Next, in step S303, the calculation netlist generation unit 225 inserts a secondary electron emission model (that is, the emission current sources IE1 to IE3 of FIG. 3C, and the like) into the node into which the electron beam probe model is inserted. The secondary electron emission model is calculated based on the electron beam optical condition (mainly, the acceleration voltage, and the like) as described in FIG. 4A. The model may be a predetermined expression and a database obtained based on the device structure and the electron beam scattering simulation (for example, database for defining emission amount of the secondary electrons for each acceleration voltage and surface potential of the sample).

<Display Contents of Display>

Figure 7:
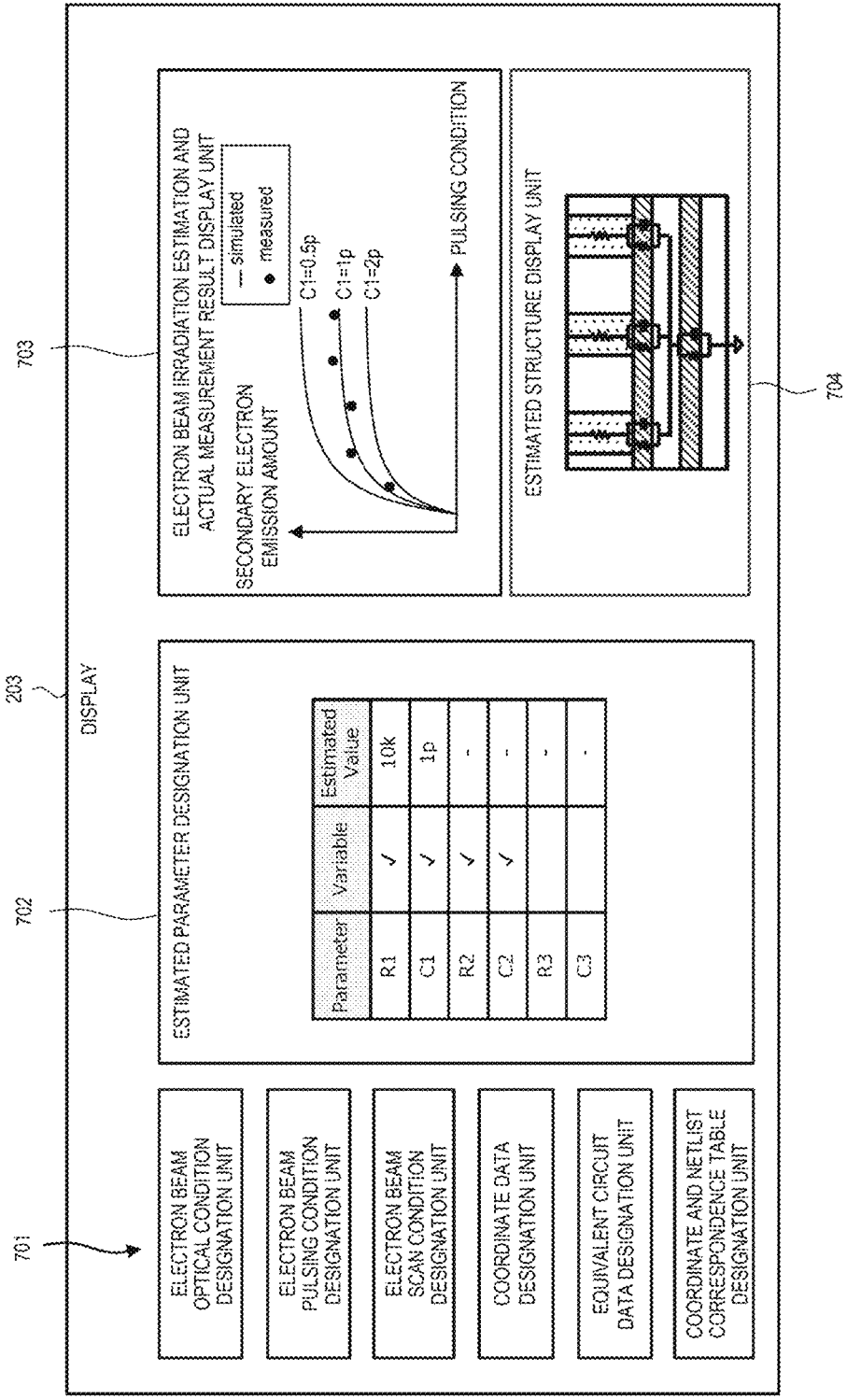
FIG. 7 is a diagram showing an example of display contents of the display in FIG. 2B.

FIG. 7 is a diagram showing an example of display contents of the display in FIG. 2B. The display contents of the display 203 of FIG. 7 include, for example, a display item 701 corresponding to various types of data (205 to 210) illustrated in FIG. 2B, a display item 702 for specifying an estimated parameter value, a display item 703 of an estimation result and the like, and a display item 704 of an estimated structure. For example, each of the various types of data (205 to 210) illustrated in FIG. 2B includes a plurality of options, and the user can select any one of the plurality of options via the display item 701.

As described with reference to FIG. 3D and the like, the display item 702 can designate an element parameter defined by the user as a variable. In the example, the resistance elements R1 and R2 and the capacitance elements C1 and C2 are designated as variables. In the example, an estimated value of the element parameter defined as the variable is also displayed. The estimated value is obtained by the processing of FIGS. 4A and 4B.

In the example, the display item 703 displays a correlation between the pulsing condition and the secondary electron emission amount, and displays the actual measured correlation (indicated by dots) and the correlation calculated by changing the element parameter value (here, the capacitance value of the capacitance element C1) by the emission amount calculation unit 227 (indicated by solid lines). The display item 703 corresponds to the estimated irradiation result display unit 235 and the electron beam irradiation result display unit 236 in FIG. 2B. For example, the pulsing condition is set such that the ON pulse period (irradiation period T1 in FIG. 1) is shortened or an OFF pulse period (blocking period T2 in FIG. 1) is prolonged.

In the example, a calculation result (correlation) when the capacitance element C1 is set to 1 pF is the most similar to the actual measurement result (correlation). As a result, the value of the capacitance element C1 is estimated to be 1 pF. Instead of the comparison between the correlations, a method may be adopted in which the actual measurement result and the calculation result are compared under the pulsing condition of a certain point. However, as shown in FIG. 1, in particular, in the case of estimating the electrical characteristics based on transient response of the RC, a highly accurate estimation result may not be obtained with the pulsing condition of only one point. Therefore, it is beneficial to use a method of comparing the correlations.

The display item 704 displays structure information corresponding to the netlist selected by the processing of FIGS. 4A and 4B. The display item 704 corresponds to the estimated netlist/circuit parameter/electronic device structure display unit 237 of FIG. 2B. The estimated structure displayed in the display item 704 may be the netlist itself, a structure showing a corresponding equivalent circuit, or a structure showing a device structure.

Figure 8:
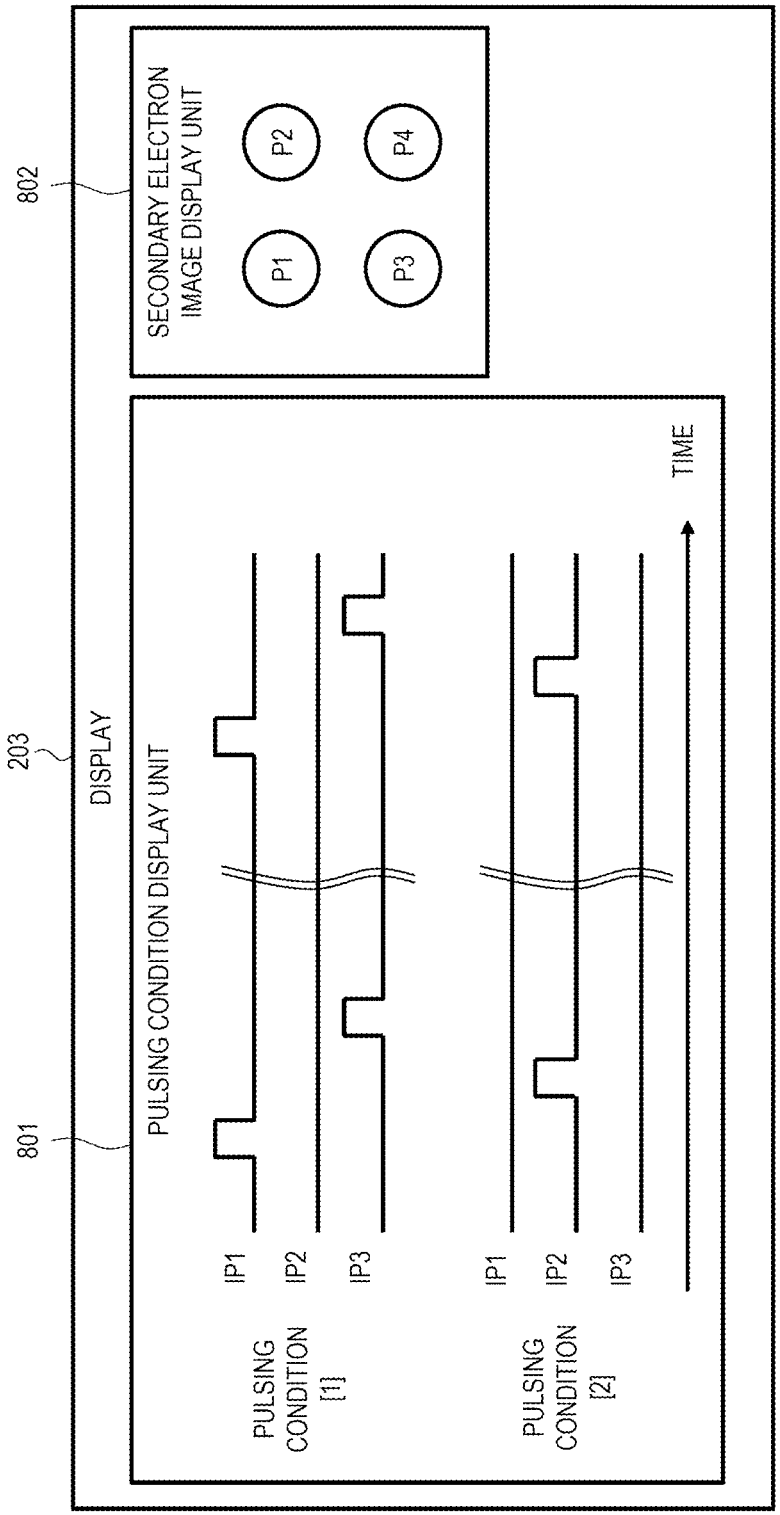
FIG. 8 is a diagram showing another example of display contents of the display in FIG. 2B.

FIG. 8 is a diagram showing another example of display contents of the display in FIG. 2B. The display contents of the display 203 of FIG. 8 include a pulsing condition display item 801 and a secondary electron image display item 802. The display item 801 displays waveforms of the probe current sources IP1 to IP3 as shown in FIG. 3B. The display item 802 displays a secondary electron image obtained from an actual measurement result of the detector 219 when actual measurement is performed under the pulsing condition displayed in the display item 801. For example, the user can deback an appropriate pulsing condition while observing the secondary electron image of the display item 802.

Main Effect of First Embodiment

As described above, by using the charged particle beam apparatus according to the first embodiment, the electrical characteristics of the sample including not only the resistance characteristic but also the capacitance characteristic can be estimated. As a result, for example, it is possible to quickly determine a cause of a defect in a manufacturing process or a cause of a defect in a product design, and it is possible to shorten a product development period, improve reliability of the product, and reduce various costs.

Second Embodiment

<Configuration of Charged Particle Beam Inspection System>

Figure 9A:
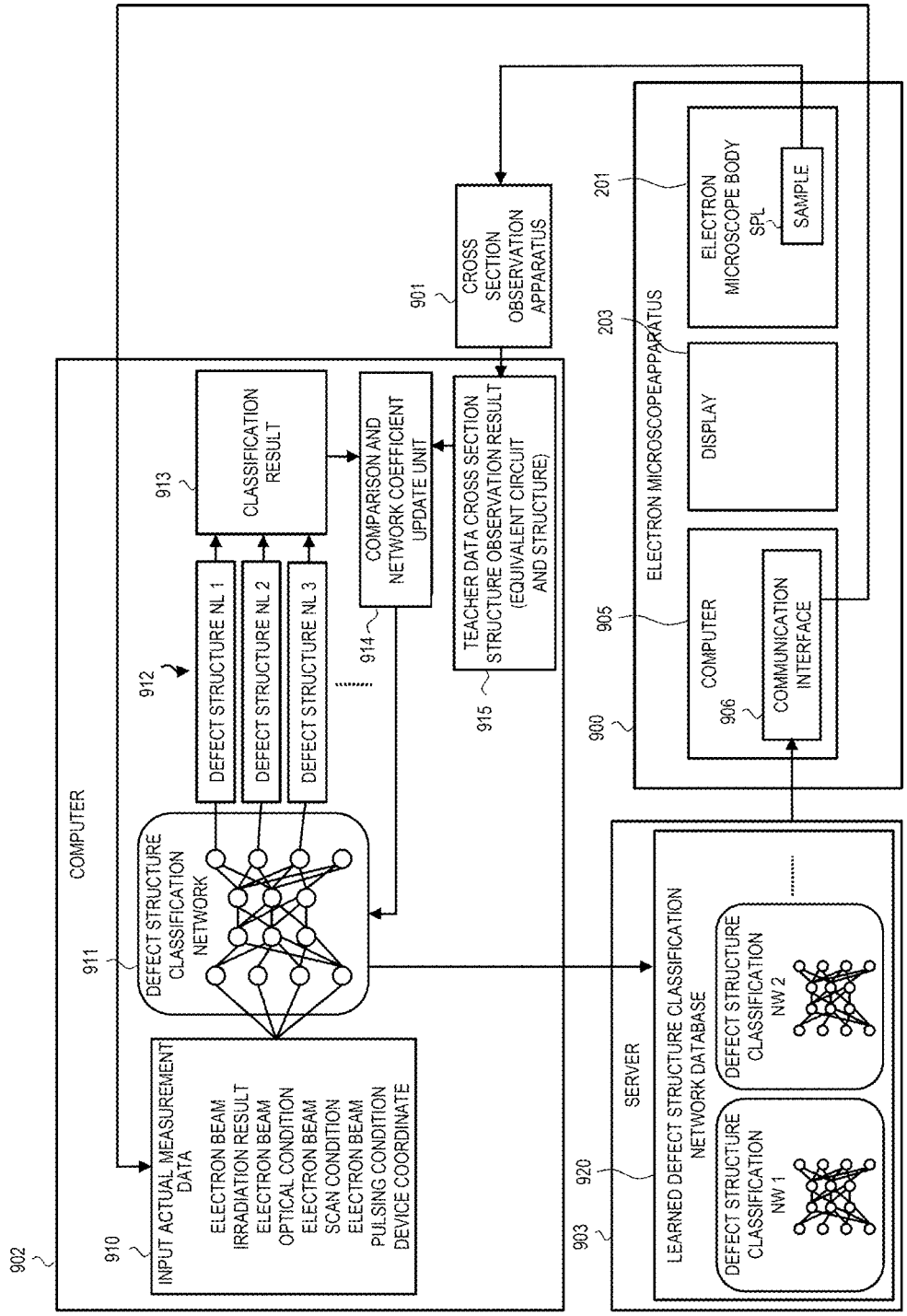
FIG. 9A is a schematic view showing a configuration example of a main part of a charged particle beam inspection system according to a second embodiment of the invention.
Figure 9B:
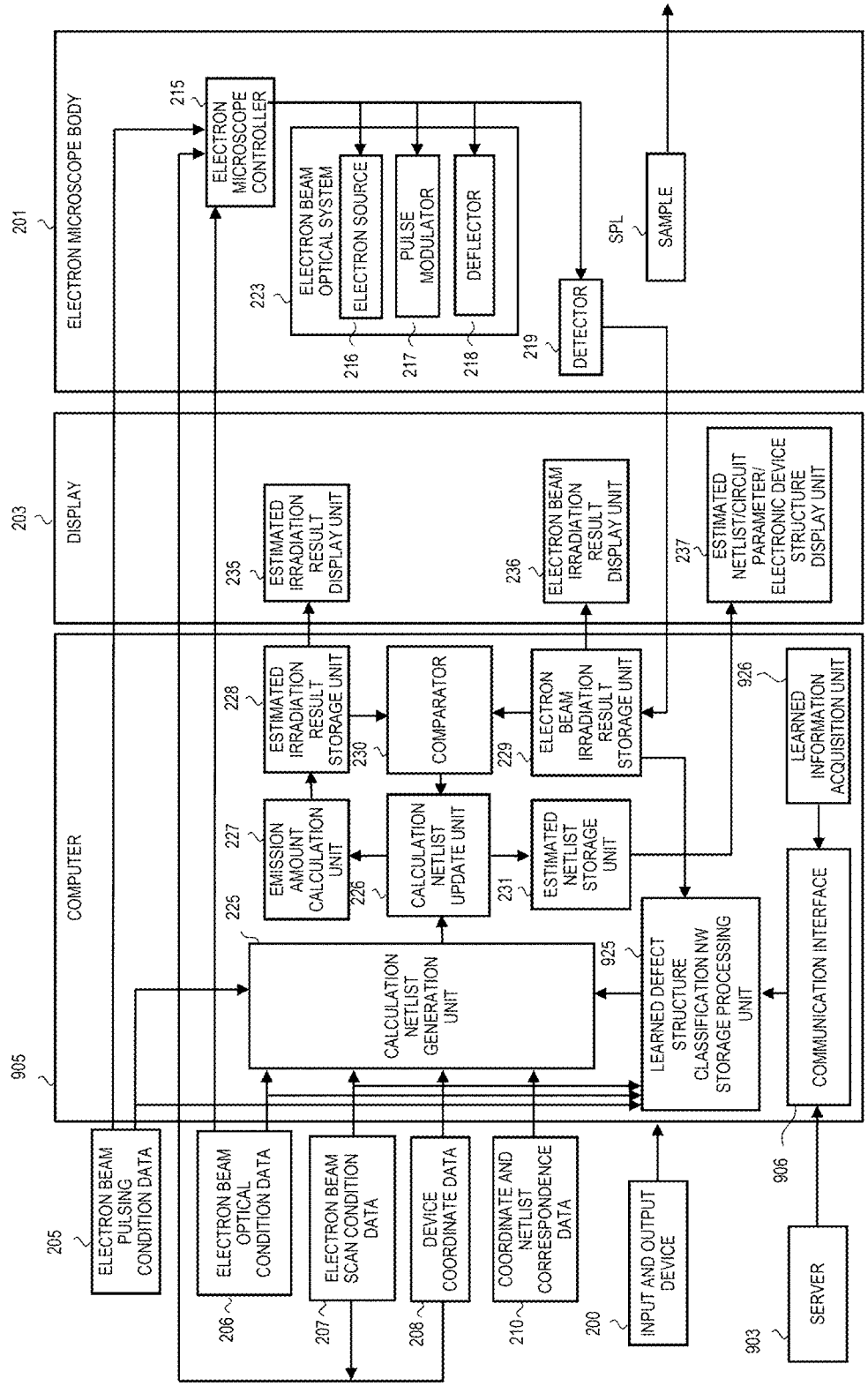
FIG. 9B is a schematic view showing a configuration example of a main part around an electron microscope apparatus in FIG. 9A.

FIG. 9A is a schematic view showing a configuration example of a main part of a charged particle beam inspection system according to a second embodiment of the invention. FIG. 9B is a schematic view showing a configuration example of a main part around an electron microscope apparatus in FIG. 9A. In the first embodiment, a defect structure netlist is created, for example, through the man power, based on a defect assumed in advance. However, since various defect structures may exist, in the first embodiment, it may be difficult to provide a corresponding defect structure netlist in advance. In such a case, it is beneficial to use a method according to the second embodiment.

The charged particle beam inspection system shown in FIG. 9A includes an electron microscope apparatus (charged particle beam apparatus) 900, across section observation apparatus 901, a computer 902, and a server 903. The computer 902 learns a correspondence between input actual measurement data 910 and the defect structure netlist (NL) 912 using artificial intelligence. The input actual measurement data 910 includes an inspection condition set including an electron beam optical condition, an electron beam scan condition, an electron beam pulsing condition, and a device coordinate, and an electron beam irradiation result actual measured by the electron microscope apparatus 900 using the inspection condition set (that is, an actual measurement result by the detector).

Then, the computer 902 registers a defect structure classification network 911 (specifically, neural network) representing the learned correspondence in a learned defect structure classification network database (learned network database) 920 of the server 903. On the other hand, the electron microscope apparatus 900 acquires a netlist used in a secondary electron emission amount calculation or the like by referring to the learned defect structure classification network database 920 via a communication interface 906 using the actual measurement data including the inspection condition set (in particular, pulsing condition) and the measurement result by the detector.

Here, a learning method of the defect structure classification network 911 (neural network) will be described. First, actual measurement data (inspection condition set and actual measurement result) obtained when a certain defect structure is inspected by an electron beam and cross section analysis data that is a result of analysis of the defect structure by the cross section observation apparatus 901 (that is, a defect structure netlist automatically or manually extracted from the cross section analysis data) are prepared. The cross section analysis data is a teacher data cross section structure observation result 915.

The computer 902 inputs the actual measurement data to the defect structure classification network 911, and compares a classification result 913 of the defect structure netlist 912 obtained based on the measurement data and the teacher data cross section structure observation result 915 using a comparison and network coefficient update unit 914. The comparison and network coefficient update unit 914 updates a coefficient in the defect structure classification network 911 so that the classification result 913 is correct.

Further, actual measurement data (inspection condition set and actual measurement result) when another defect structure is inspected by an electron beam and cross section analysis data of the defect structure are prepared, and the coefficient of the defect structure classification network 911 (neural network) is updated in the same manner. By repeating such processing, the learning of the neural network proceeds. The computer 902, for example, when the learning is converged to some extent, registers the defect structure classification network 911 as a learned defect structure classification network in the learned defect structure classification network database (learned network database) 920 of the server 903.

The electron microscope apparatus 900 shown in FIG. 9B has a different internal configuration of a computer 905 as compared with the configuration example shown in FIG. 2B, and further has a configuration in which the netlist 209 of FIG. 2B is deleted. The computer 905 further includes a communication interface 906 that communicates with the server 903, a learned defect structure classification network (NW) storage processing unit 925, and a learned information acquisition unit 926, as compared with the computer 202 of FIG. 2B.

The learned information acquisition unit 926 acquires a learned defect structure classification network (neural network) from the server 903 via the communication interface 906, and stores the learned defect structure classification network in the learned defect structure classification network storage processing unit 925. The learned defect structure classification network storage processing unit 925 generates a netlist (for example, a defect structure netlist) based on the actual measurement result of the detector 219 stored in the electron beam irradiation result storage unit 229 and the inspection condition set (including the electron beam optical condition, the electron beam scan condition, and the electron beam pulsing condition). The calculation netlist generation unit 225 generates a calculation netlist using the netlist based on the learned defect structure classification network storage processing unit 925.

<Operation of Charged Particle Beam Apparatus>

Figure 10A:
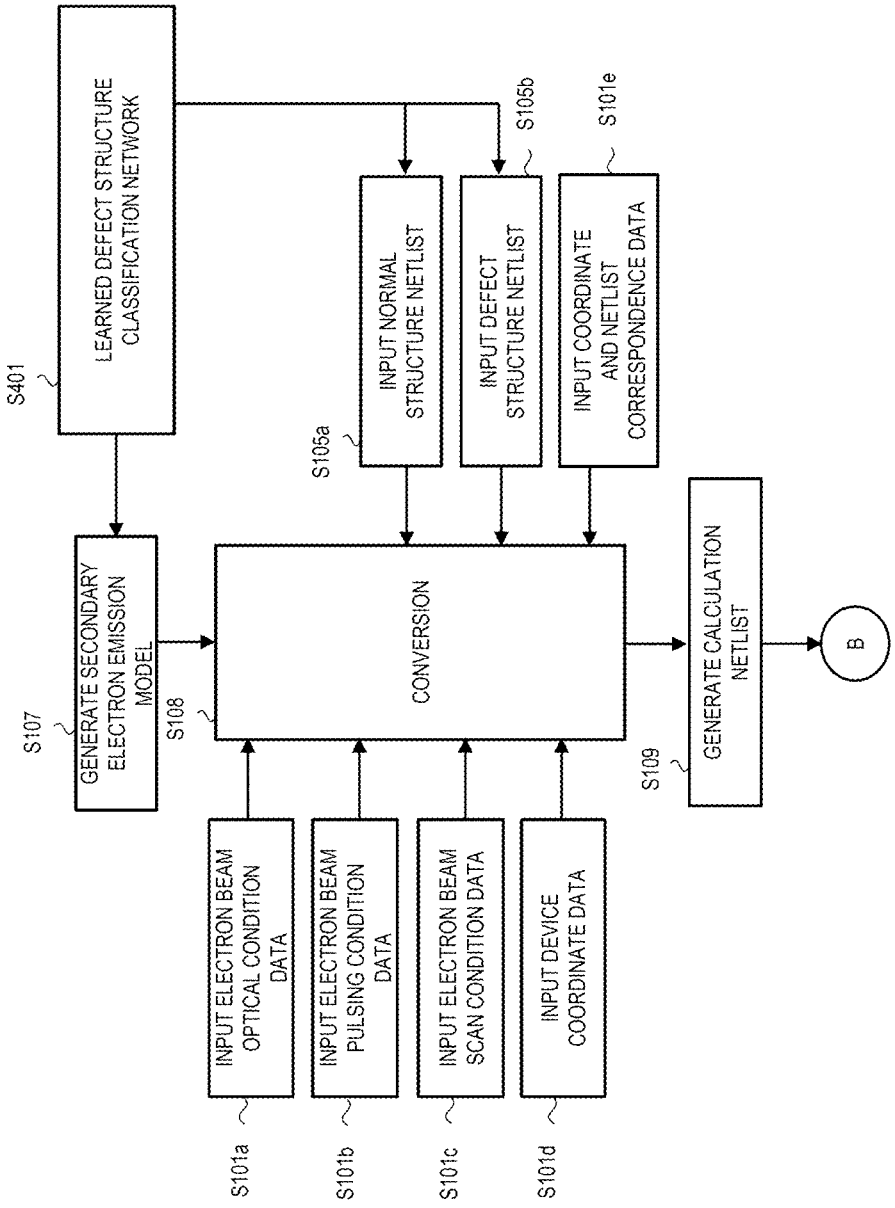
FIG. 10A is a flowchart showing an operation example of a charged particle beam apparatus (electron microscope apparatus) of FIG. 9B.

FIG. 10A is a flowchart showing an operation example of the charged particle beam apparatus (electron microscope apparatus) of FIG. 9B, and FIG. 10B is a flowchart following FIG. 10A. In the flowchart of FIG. 10A, unlike the flowchart of FIG. 4A, as shown in step S401, netlists of the normal structure and the defect structure in steps S105a and S105b are generated from the learned defect structure classification network (neural network). In the example, a secondary electron emission model in step S107 is also generated from the learned defect structure classification network.

Compared with the flowchart of FIG. 4B, the flowchart of FIG. 10B is different in that the processing of steps S402 and S501 is added, and that the loop route (that is, a route for exchanging the netlist) returning from step S118 to step S110 in FIG. 4B is deleted. The processing of step S501 is performed after the actual measurement database is stored in the electron beam irradiation result storage unit 229 in step S205.

In step S501, the electron beam irradiation result storage unit 229 outputs the actual measurement database to the learned defect structure classification network storage processing unit 925. In response to this, in step S110, a netlist is selected. More specifically, the netlist is generated by the learned defect structure classification network storage processing unit 925.

The processing of step S402 is performed when the parameter update termination condition is satisfied in step S118. In step S402, the calculation netlist update unit 226 issues an unestimatable result notification indicating that the parameter update termination condition is satisfied. When the unestimatable result notification is issued (in other words, when the matching comparison result is not obtained by the comparator 230), the sample SPL is automatically or manually conveyed to the cross section observation apparatus 901 of FIG. 9A.

The cross section observation apparatus 901 automatically or manually observes the cross section structure of the sample SPL to create cross section structure data serving as an observation result. The computer 902 of FIG. 9A creates a new defect structure netlist based on the observation result of the cross section observation apparatus 901, and learns the correspondence between the created netlist and the actual measurement data (inspection condition set and actual measurement result) to the defect structure classification network 911 (neural network). As a result, the defect structure classification network 911 is updated so as to correspond to a new defect structure.

Main Effect of Second Embodiment

As described above, by using the charged particle beam inspection system according to the second embodiment, the same effects as those described in the first embodiment can be obtained. In addition, as compared with the case of the first embodiment, since there is no need to perform calculation while changing the netlist, the inspection time can be shortened. Further, since the corresponding defect structure is automatically (or semi-automatically) updated, it can contribute to automation of the inspection system.

While the invention made by the present inventors has been specifically described based on the embodiments, the invention is not limited to the embodiments described above, and various changes and modifications may be made without departing from the scope of the invention. For example, the embodiments described above have been described in detail for easy understanding of the invention, the invention is not necessarily limited to those including all the configurations described above. Apart of the configuration of one embodiment can be replaced with the configuration of another embodiment, and the configuration of another embodiment can be added to the configuration of one embodiment. A part of the configuration of each embodiment may be added, deleted, or replaced with another configuration.

What is claimed is:

1. A charged particle beam apparatus that estimates electrical characteristics of a sample using a netlist representing an equivalent circuit of a device structure of the sample, correspondence data representing a correspondence between a node of the netlist and a coordinate on the sample, and pulsing condition data that defines a pulsing condition when irradiating the sample with a charged particle beam in a pulsed manner, the charged particle beam apparatus comprising:

a charged particle beam optical system that irradiates a predetermined coordinate on the sample with a charged particle beam based on the pulsing condition;

a detector that actually measures an emission amount of electrons according to the irradiation of the charged particle beam by the charged particle beam optical system;

an emission amount calculation unit that calculates, for the node on the netlist corresponding to the predetermined coordinate, an emission amount of electrons according to a temporal change in a charged state accompanying the irradiation of the charged particle beam based on the pulsing condition; and a comparator that compares an actual measurement result by the detector with a calculation result by the emission amount calculation unit.

2. The charged particle beam apparatus according to claim 1, wherein
the netlist includes a plurality of netlists including a netlist of a normal structure and a netlist of a defect structure reflecting a predetermined defect, and
the emission amount calculation unit calculates the emission amount of electrons while changing the plurality of netlists and element parameter values included in the plurality of netlists.

3. The charged particle beam apparatus according to claim 1, wherein
the emission amount calculation unit calculates the emission amount of electrons using an electron emission model based on a charged particle beam scattering simulation.

4. The charged particle beam apparatus according to claim 1, wherein
the pulsing condition data defines a plurality of pulsing conditions in which an ON pulse period or a duty ratio is different,
the charged particle beam optical system emits a charged particle beam for each of the plurality of pulsing conditions,
the detector actually measures an emission amount of electrons for each of the plurality of pulsing conditions,
the emission amount calculation unit calculates an emission amount of electrons for each of the plurality of pulsing conditions under a condition that the charged particle beam is irradiated for each of the plurality of pulsing conditions, and
the comparator compares an actual measurement result of each of the plurality of pulsing conditions by the detector with a calculation result of each of the plurality of pulsing conditions by the emission amount calculation unit.

5. The charged particle beam apparatus according to claim 1, wherein
the emission amount calculation unit calculates, for the node on the netlist, a value proportional to a sum of emission amounts of electrons obtained for each of a plurality of irradiations of a charged particle beam in a pulsed manner based on the pulsing condition.

6. A charged particle beam inspection system comprising:
a charged particle beam apparatus that estimates electrical characteristics of a sample using a netlist representing an equivalent circuit of a device structure of the sample, correspondence data representing a correspondence between a node of the netlist and a coordinate on the sample, and pulsing condition data that defines a pulsing condition when irradiating the sample with a charged particle beam in a pulsed manner; and a computer that creates a learned network database, wherein the charged particle beam apparatus includes a charged particle beam optical system that irradiates a predetermined coordinate on the sample with a charged particle beam based on the pulsing condition, a detector that actually measures an emission amount of electrons according to the irradiation of the charged particle beam by the charged particle beam optical system, an emission amount calculation unit that calculates, for the node on the netlist corresponding to the predetermined coordinate, an emission amount of electrons according to a temporal change in a charged state accompanying the irradiation of the charged particle beam based on the pulsing condition while changing an element parameter value included in the netlist, and a comparator that compares an actual measurement result by the detector with a calculation result by the emission amount calculation unit, the computer learns a correspondence among the pulsing condition, the actual measurement result by the detector, and the netlist by using artificial intelligence, and registers a neural network representing the learned correspondence in a learned network database, and the emission amount calculation unit refers to the learned network database using the pulsing condition and the actual measurement result by the detector to obtain a netlist used in the calculation.

7. The charged particle beam inspection system according to claim 6, further comprising:

a cross section observation apparatus that observes a cross section structure of the sample when a matching comparison result is not obtained by the comparator, wherein the computer creates a new netlist based on an observation result of the cross section observation apparatus, and learns a correspondence among the created netlist, the pulsing condition, and the actual measurement result by the detector to the neural network.

8. The charged particle beam inspection system according to claim 6, wherein the emission amount calculation unit calculates the emission amount of electrons using an electron emission model based on a charged particle beam scattering simulation.

9. The charged particle beam inspection system according to claim 6, wherein the pulsing condition data defines a plurality of pulsing conditions in which an ON pulse period or a duty ratio is different, the charged particle beam optical system emits a charged particle beam for each of the plurality of pulsing conditions, the detector actually measures an emission amount of electrons for each of the plurality of pulsing conditions, the emission amount calculation unit calculates an emission amount of electrons for each of the plurality of pulsing conditions under a condition that the charged particle beam is irradiated for each of the plurality of pulsing conditions, the comparator compares an actual measurement result for each of the plurality of pulsing conditions by the detector with a calculation result of each of the plurality of pulsing conditions by the emission amount calculation unit, and the computer learns a correspondence among the plurality of pulsing conditions, the measurement result for each of the plurality of pulsing conditions, and the netlist using artificial intelligence.

10. The charged particle beam inspection system according to claim 6, wherein the emission amount calculation unit calculates, for the node on the netlist, a value proportional to a sum of emission amounts of electrons obtained for each of a plurality of irradiations of a charged particle beam in a pulsed manner based on the pulsing condition.

\* \* \* \* \*